US010283531B2

(12) United States Patent
Bae et al.

(10) Patent No.: US 10,283,531 B2
(45) Date of Patent: May 7, 2019

(54) THIN FILM TRANSISTOR, METHOD FOR MANUFACTURING THE SAME, AND DISPLAY DEVICE INCLUDING THE SAME

(71) Applicant: LG Display Co., Ltd., Seoul (KR)

(72) Inventors: JunHyeon Bae, Goyang-si (KR); JongUk Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/660,803

(22) Filed: Jul. 26, 2017

(65) Prior Publication Data

US 2018/0033804 A1 Feb. 1, 2018

(30) Foreign Application Priority Data

Jul. 29, 2016 (KR) .................. 10-2016-0097308
Aug. 23, 2016 (KR) .................. 10-2016-0107224

(51) Int. Cl.
*H01L 29/786* (2006.01)
*H01L 29/66* (2006.01)
(Continued)

(52) U.S. Cl.
CPC .. *H01L 27/1225* (2013.01); *H01L 21/823871* (2013.01); *H01L 29/1054* (2013.01);
(Continued)

(58) Field of Classification Search
CPC .. H01L 27/12–27/1255; H01L 27/1225; H01L 27/1259–27/1296; H01L 29/41733; H01L 29/4175; H01L 29/42384–29/42392; H01L 29/4908; H01L 29/1054; H01L 29/7869; H01L 29/786–29/78696; H01L 29/78681; H01L 29/458; H01L 21/823871; H01L 2029/42388; H01L 2021/775; H01L 29/66969; H01L 29/78633; H01L 29/12;
(Continued)

(56) References Cited

U.S. PATENT DOCUMENTS 5,138,409 A 8/1992 Kawai
8,378,423 B2\* 2/2013 Liang ............... H01L 29/42384
257/365

(Continued)

FOREIGN PATENT DOCUMENTS

KR 20070052565 5/2007

OTHER PUBLICATIONS

Extended European Search Report for European Patent Application No. EP 17183282.7, dated Dec. 15, 2017, 9 pages.

*Primary Examiner* — Natalia A Gondarenko
(74) *Attorney, Agent, or Firm* — Fenwick & West LLP

(57) ABSTRACT

Disclosed is a thin film transistor including both an N-type semiconductor layer and a P-type semiconductor layer, a method for manufacturing the same, and a display device including the same, wherein the thin film transistor may include a first gate electrode on a substrate; a first gate insulating film covering the first gate electrode; a semiconductor layer on the first gate insulating film; a second gate insulating film covering the semiconductor layer; and a second gate electrode on the second gate insulating film, wherein the semiconductor layer includes the N-type semiconductor layer and the P-type semiconductor layer.

18 Claims, 13 Drawing Sheets

(51) Int. Cl.
*H01L 29/417* (2006.01)
*H01L 21/8238* (2006.01)
*H01L 21/18* (2006.01)
*H01L 21/425* (2006.01)
*H01L 29/10* (2006.01)
*H01L 27/12* (2006.01)
*H01L 21/44* (2006.01)
*H01L 21/34* (2006.01)

(52) U.S. Cl.
CPC .. H01L 29/41733 (2013.01); H01L 29/66969 (2013.01); H01L 29/7869 (2013.01); H01L 29/78633 (2013.01); H01L 29/78696 (2013.01)

(58) Field of Classification Search
CPC ......... H01L 29/78693; H01L 29/78675; H01L 29/78606; H01L 29/0847; H01L 29/518; H01L 29/517; H01L 27/092; H01L 27/1214; H01L 27/1248; H01L 27/1251; H01L 27/3262; H01L 27/1288; H01L 27/3258; H01L 21/02164; H01L 21/02362; H01L 21/02488; H01L 21/02554; H01L 21/76846; H01L 21/8238; H01L 21/336; H01L 21/471; H01L 23/53295; H01L 33/08

USPC ....... 257/43, 57, 59, 368, E21.532, E21.414, 257/E27.06; 438/104, 151, 158
See application file for complete search history.

(56) References Cited

U.S. PATENT DOCUMENTS

| | | | |
|---|---|---|---|
| 2003/0141504 A1 | 7/2003 | Kuwabara et al. | |
| 2005/0139925 A1* | 6/2005 | You | H01L 21/2026 257/351 |
| 2006/0246740 A1* | 11/2006 | Cartier | H01L 21/28079 438/778 |
| 2010/0148825 A1 | 6/2010 | Park et al. | |
| 2010/0176395 A1 | 7/2010 | Choi et al. | |
| 2010/0264956 A1* | 10/2010 | Yin | H01L 21/823807 326/120 |
| 2011/0180793 A1* | 7/2011 | Taniguchi | H01L 29/7869 257/43 |
| 2013/0015448 A1* | 1/2013 | Yang | H01L 27/0688 257/59 |
| 2014/0246653 A1* | 9/2014 | Wu | H01L 27/1222 257/40 |
| 2015/0364469 A1* | 12/2015 | Tsunashima | H01L 27/092 257/351 |
| 2017/0162606 A1* | 6/2017 | Yan | H01L 27/1251 |
| 2017/0301702 A1* | 10/2017 | Kim | G09G 3/3677 |

* cited by examiner

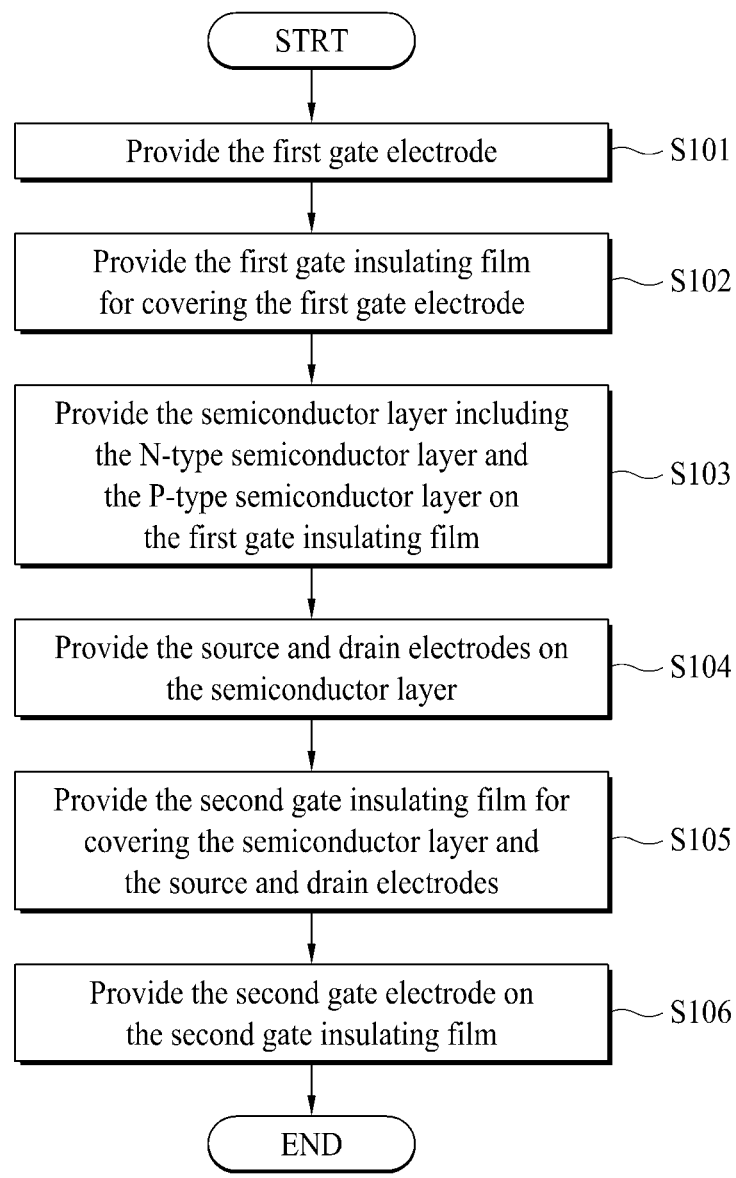

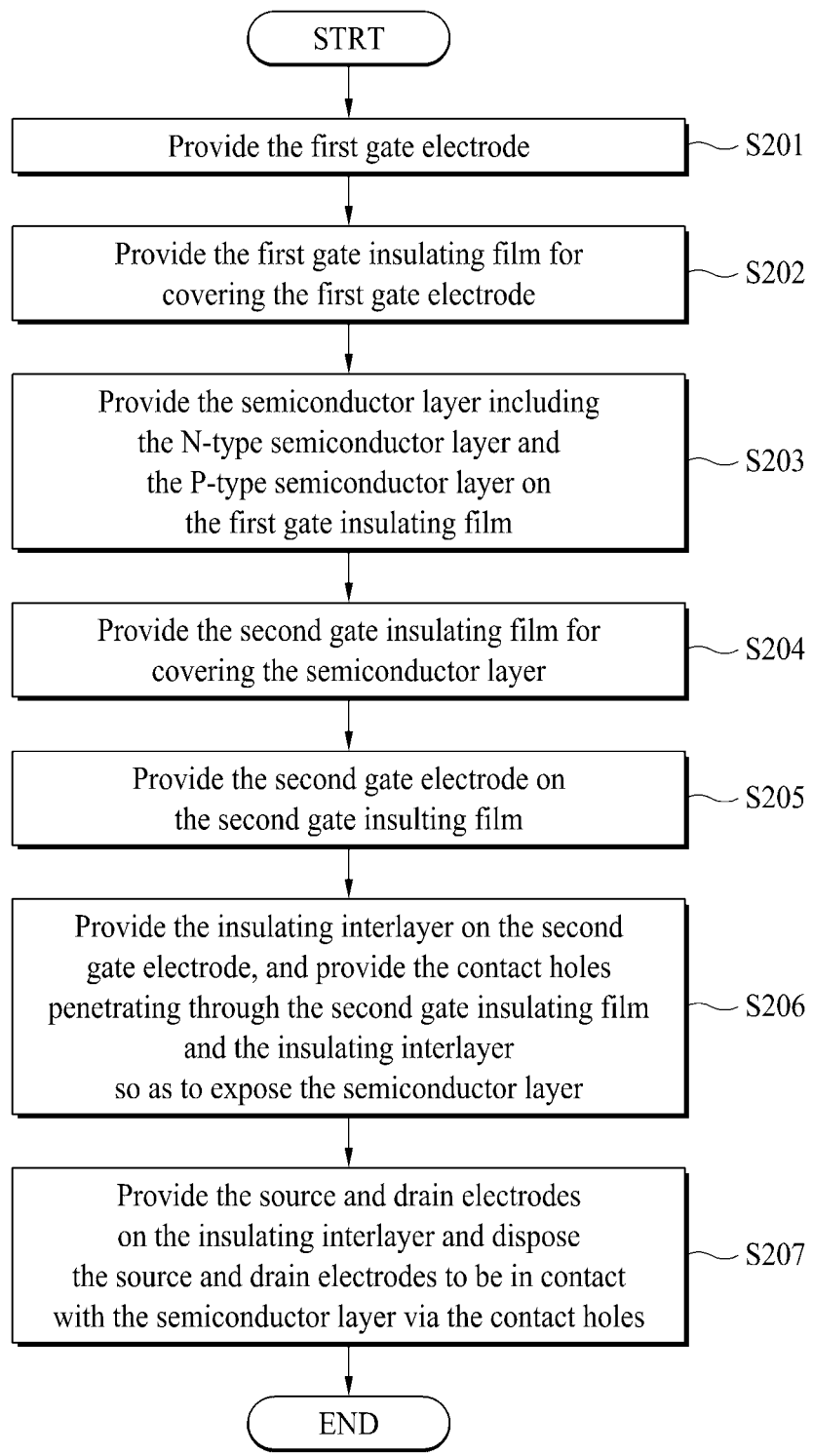

THIN FILM TRANSISTOR, METHOD FOR MANUFACTURING THE SAME, AND DISPLAY DEVICE INCLUDING THE SAME

CROSS REFERENCE TO RELATED APPLICATIONS

This application claims the benefit of the Korean Patent Application No. 10-2016-0097308 filed on Jul. 29, 2016 and Korean Patent Application No. 10-2016-0107224 filed on Aug. 23, 2016, both of which are hereby incorporated by reference in their entirety.

BACKGROUND

Field of the Disclosure

Embodiments of the present disclosure relate to a thin film transistor, a method for manufacturing the same, and a display device including the same.

Discussion of the Related Art

With the advancement of an information-oriented society, various requirements for the display device of displaying an image are increasing. Thus, there are various display devices of a liquid crystal display (LCD) devices, a plasma display panel (PDP) devices, and an organic light emitting display (OLED) device.

The display device may include a display panel, a gate driving circuit, a data driving circuit, and a timing controller. The display panel may include gate lines, data lines, and pixels provided at every cross section of the gate and data lines, wherein data voltages of the data lines are supplied to the pixels when gate signals are supplied to the gate lines. The pixels emit light with a predetermined luminance in accordance with the data voltages. The display device drives the pixels and the gate driving circuits by the use of thin film transistors corresponding to switching devices. The thin film transistor may be a metal oxide semiconductor field effect transistor (MOSFET) for controlling a current flow by an electric field.

A complementary metal oxide semiconductor (CMOS) corresponding to an inverter may be used as the switching devices of the display device for appropriately outputting an input signal, wherein the CMOS requires both N-type MOSFET and P-type MOSFET. That is, the CMOS includes at least two thin film transistors so that it has limitation of size reduction in the CMOS.

SUMMARY

Accordingly, embodiments of the present disclosure are directed to a thin film transistor that substantially obviates one or more problems due to limitations and disadvantages of the related art.

An aspect of embodiments of the present disclosure is directed to provide a thin film transistor including both an N-type semiconductor layer and a P-type semiconductor layer, a method for manufacturing the same, and a display device including the same.

Additional advantages and features of embodiments of the disclosure will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the disclosure, as embodied and broadly described herein, there is provided a thin film transistor that may include a first gate electrode disposed on a substrate; a first gate insulating film covering the first gate electrode; a semiconductor layer disposed on the first gate insulating film; a second gate insulating film covering the semiconductor layer; and a second gate electrode disposed on the second gate insulating film, wherein the semiconductor layer includes an N-type semiconductor layer and a P-type semiconductor layer.

In another aspect of an embodiment of the present disclosure, there is provided a method for manufacturing a thin film transistor that may include providing a first gate electrode on a substrate; providing a first gate insulating film that covers the first gate electrode; providing a semiconductor layer including an N-type semiconductor layer and a P-type semiconductor layer on the N-type semiconductor layer; providing a second gate insulating film that covers the semiconductor layer; and providing a second gate electrode on the second gate insulating film.

In another aspect of an embodiment of the present disclosure, there is provided a display device comprising: a display panel including a plurality of data lines, a plurality of gate lines, and a plurality of pixels provided at cross sections of the plurality of gate and the plurality of data lines; a data driving circuit that supplies data voltages to the plurality of data lines; and a gate driving circuit that supplies gate signals to the plurality of gate lines, wherein each of the plurality of pixels or the gate driving circuit includes a thin film transistor, wherein the thin film transistor comprises: a first gate electrode disposed on a substrate; a first gate insulating film covering the first gate electrode; a semiconductor layer disposed on the first gate insulating film; a second gate insulating film covering the semiconductor layer; and a second gate electrode disposed on the second gate insulating film, wherein the semiconductor layer includes an N-type semiconductor layer and a P-type semiconductor layer.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings:

FIG. 7 is a flow chart illustrating a method for manufacturing the thin film transistor according to one embodiment of the present disclosure;

FIG. 10 is a flow chart illustrating a method for manufacturing the thin film transistor according to another embodiment of the present disclosure;

DETAILED DESCRIPTION

Figure 1:
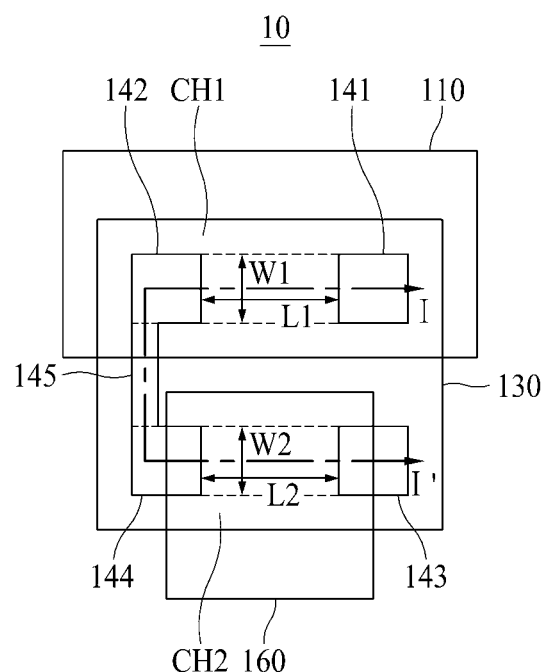
FIG. 1 is a plan view illustrating a thin film transistor according to one embodiment of the present disclosure.

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a thin film transistor according to the embodiment of the present disclosure, a method for manufacturing the same, and a display device including the same will be described with reference to the accompanying drawings.

Figure 2:
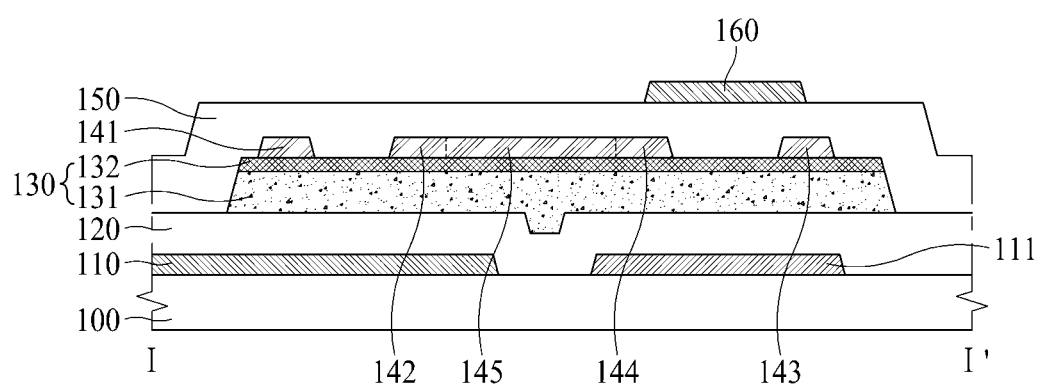
FIG. 2 is a cross sectional view along I-I' line of FIG. 1 according to one embodiment of the present disclosure.

FIG. 1 is a plan view illustrating a thin film transistor according to one embodiment of the present disclosure. FIG. 2 is a cross sectional view along I-I' line of FIG. 1.

Referring to FIGS. 1 and 2, the thin film transistor 10 according to one embodiment of the present disclosure may include a first gate electrode 110, a semiconductor layer 130, a first source electrode 141, a first drain electrode 142, a second source electrode 143, a second drain electrode 144, and a second gate electrode 160.

The thin film transistor 10 is provided on a substrate 100. The substrate 100 may be formed of plastic or glass.

A buffer film may be provided on the substrate 100, wherein the buffer film protects the thin film transistor 10 from moisture permeating through the substrate 100. The buffer film may be formed of a plurality of inorganic films alternately deposited. For example, the buffer film may be formed in a multi-layered structure obtained by alternately depositing at least one inorganic film among silicon oxide (SiOx), silicon nitride (SiNx), and silicon oxinitride (SiON).

The first gate electrode 110 of the thin film transistor may be provided on the substrate 100 or the buffer film. The first gate electrode 110 may be formed in a single-layered structure of any one selected from a group consisting of molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys.

A first gate insulating film 120 may be provided on the first gate electrode 110. The first gate insulating film 120 may be formed in a single-layered structure of an inorganic film such as silicon oxide (SiOx) or silicon nitride (SiNx), or a multi-layered structure of inorganic films such as silicon oxide (SiOx) and silicon nitride (SiNx).

The first gate electrode 110 prevents light from being incident on a first channel area (CH1) from the substrate 100, to thereby protect the first channel area (CH1) from the light. Also, a light shielding layer 111 may be additionally provided in an area corresponding to a second channel area (CH2), as shown in FIG. 2, to thereby prevent light from being incident on the second channel area (CH2). The light shielding layer 111 may be provided in the same layer as the first gate electrode 110, and may be formed of the same material as the first gate electrode 110.

A semiconductor layer 130 may be provided on the first gate insulating film 120. A portion of the semiconductor layer 130 may be overlapped with the first gate electrode 110.

The semiconductor layer 130 may include an N-type semiconductor layer 131 and a P-type semiconductor layer 132. The N-type semiconductor layer 131 is provided on the first gate insulating film 120, and the P-type semiconductor layer 132 is provided on the N-type semiconductor layer 132. An overlapping area between the N-type semiconductor layer 131 and the first gate electrode 110 disposed below the N-type semiconductor layer 131 is defined as the first channel area (CH1). An overlapped area between the P-type semiconductor layer 132 and the second gate electrode 160 disposed above the P-type semiconductor layer 132 is defined as the second channel area (CH2).

The N-type semiconductor layer 131 may be formed of an N-type oxide semiconductor layer, and the P-type semiconductor layer 132 may be formed of a P-type oxide semiconductor layer. If the N-type semiconductor layer 131 is formed of the N-type oxide semiconductor layer, it may be indium-gallium-zinc-oxide (IGZO), indium-zinc-oxide (IZO), indium-gallium-oxide (IGO), indium-tin-zinc-oxide (ITZO), gallium-tin-oxide (GTO), zinc-tin-oxide (ZTO), indium-aluminum-zinc-oxide (IAZO), aluminum-zinc-oxide (AZO), indium-tin-oxide (ITO), aluminum-tin-oxide (ATO), or gallium-zinc-oxide (GZO). If the P-type semiconductor layer 132 is formed of the P-type oxide semiconductor layer, it may be copper oxide Cu2O, tin oxide SnO, nickel oxide NiO, CuMO2 (Delafossite, M=Al, Ga, In, Sr, Y, Sc, Cr), ZnM2O4 (Spinel, M=Co, Rh, Ir), Ln/Cu/O/Ch (oxychalcogenide, Ln=lanthanoids (La~Lu), Ch=Se, S, Te), or Cu-Nanowire.

If the N-type semiconductor layer 131 is formed of the N-type oxide semiconductor layer, and the P-type semiconductor layer 132 is formed of the P-type oxide semiconductor layer, a thickness of the P-type semiconductor layer 132 may be less than a thickness of the N-type semiconductor layer 131. For example, the thickness of the N-type semiconductor layer 131 may be 30 nm or less than 30 nm, and the thickness of the P-type semiconductor layer 132 may be 10 nm or less than 10 nm.

Figure 3:
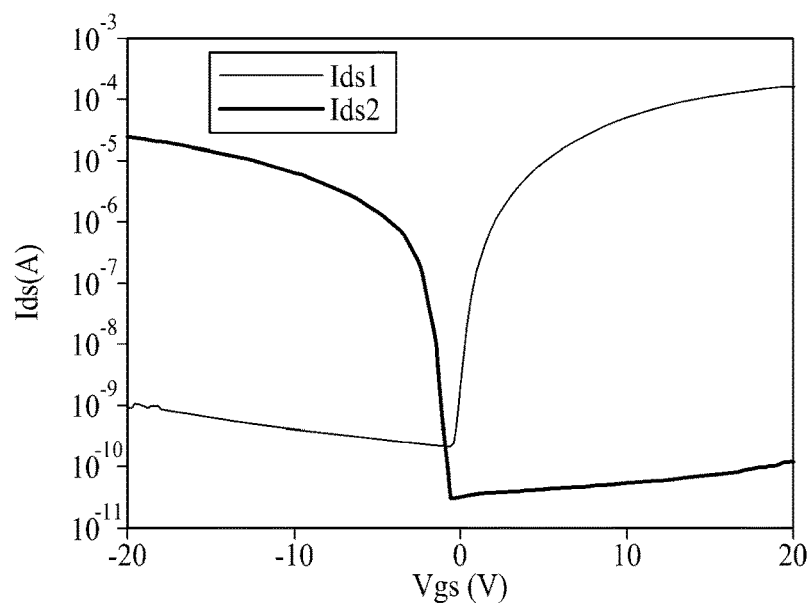
FIG. 3 is a graph showing the N-type semiconductor properties and the P-type semiconductor properties of the thin film transistor according to one embodiment of the present disclosure.

A grain boundary of the P-type semiconductor layer 132 has an influence on the device properties. In detail, the device properties of the thin film transistor may be improved by the increase of the grain boundary. If the P-type semiconductor layer 132 is formed in a thin film of 10 nm or less than 10 nm on the N-type semiconductor layer 131, a grain size of the P-type semiconductor layer 132 is decreased so that the grain boundary is increased, to thereby improve the properties of the P-type semiconductor layer 132. In more detail, if the P-type semiconductor layer 132 has the improved properties, for example, reduced ionized defect and increased grain boundary, as shown in FIG. 3, it has a low threshold voltage near 0V, and a saturation mobility is improved to be 4.0 cm2/Vs or more than 4.0 cm2/Vs. The thickness and effect of the P-type semiconductor layer 132 will be described in detail with reference to FIGS. 3 and 4.

The N-type semiconductor layer 131 may be formed of an N-type poly silicon layer, and the P-type semiconductor layer 132 may be formed of a P-type poly silicon layer.

The first and second source electrodes 141 and 143 and the first and second drain electrodes 142 and 144 may be provided on the semiconductor layer 130. The first source electrode 141 and the first drain electrode 142 may be overlapped with the first gate electrode 110.

The first drain electrode 142 may be connected with the second drain electrode 144 via a connection electrode 145. Therefore, the thin film transistor 10 may function as a complementary metal oxide semiconductor (CMOS). It is possible to omit the connection electrode 145.

A second gate insulating film 150 may be provided on the semiconductor layer 130, the first and second source electrodes 141 and 143, the first and second drain electrodes 142 and 144, and the connection electrode 145. The second gate insulating film 150 may be formed in a single-layered structure of an inorganic film such as silicon oxide (SiOx) or silicon nitride (SiNx), or a multi-layered structure of inorganic films such as silicon oxide (SiOx) and silicon nitride (SiNx).

The second gate electrode 160 may be provided on the second gate insulating film 150. The second gate electrode 160 may be overlapped with the second source electrode 143 and the second drain electrode 144. The second gate electrode 160 may be formed in a single-layered structure of any one selected from a group consisting of molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys.

The first gate electrode 110 may be partially overlapped with a portion of the semiconductor layer 130, and the second gate electrode 160 may be partially overlapped with another portion of the semiconductor layer 130. The portion of the semiconductor layer 130 may not be overlapped with the second gate electrode 160, and the another portion of the semiconductor layer 130 may not be overlapped with the first gate electrode 110.

In detail, the overlapping area between the N-type semiconductor layer 131 of the semiconductor layer 130 and the first gate electrode 110, which is disposed between the first source electrode 141 and the first drain electrode 142, may be defined as the first channel area (CH1) having the N-type semiconductor properties. A channel length (L1) of the first channel area (CH1) may be defined by a distance between the first source electrode 141 and the first drain electrode 142. A channel width (W1) of the first channel area (CH1) may be defined by a width of each of the first source and drain electrodes 141 and 142.

Also, the overlapping area between the P-type semiconductor layer 132 of the semiconductor layer 130 and the second gate electrode 160, which is disposed between the second source electrode 142 and the second drain electrode 144, may be defined as the second channel area (CH2) having the P-type semiconductor properties. A channel length (L2) of the second channel area (CH2) may be defined by a distance between the second source electrode 143 and the second drain electrode 144. A channel width (W2) of the second channel area (CH2) may be defined by a width of each of the second source and drain electrodes 143 and 144.

As described above, the thin film transistor 10 according to one embodiment of the present disclosure includes both the N-type semiconductor layer 131 and the P-type semiconductor layer 132 so that it is possible to provide the overlapping area between the N-type semiconductor layer 131 and the first gate electrode 110, which is disposed in the area between the first source electrode 141 and the first drain electrode 142, and also to provide the overlapping area between the P-type semiconductor layer 132 and the second gate electrode 160, which is disposed in the area between the second source electrode 143 and the second drain electrode 144. As a result, it is possible to realize the thin film transistor having both the N-type semiconductor properties and the P-type semiconductor properties.

FIG. 3 is a graph showing the N-type semiconductor properties and the P-type semiconductor properties of the thin film transistor according to one embodiment of the present disclosure. In FIG. 3, it shows a current value (Ids1) of the first channel area (CH1) in accordance with a gate-source voltage (Vgs) when the channel width (W1) of the first channel area is 980 μm, and the channel length (L1) is 150 μm, and also shows a current value (Ids2) of the second channel area (CH2) in accordance with a gate-source voltage (Vgs) when the channel width (W2) of the second channel area is 1960 μm, and the channel length (L2) is 960 μm. In FIG. 3, the X-axis indicates the gate-source voltage (Vgs), and the Y-axis indicates the current value (Ids) of the channel area.

Referring to FIG. 3, the first channel area (CH1) corresponds to an N channel area. If the gate-source voltage (Vgs) has a positive voltage, the current value (Ids1) of the first channel area (CH1) has the N-type semiconductor properties which are raised in proportion to the gate-source voltage (Vgs). Therefore, the first channel area (CH1) may be turned on when a voltage difference between gate-source voltage (Vgs) and a threshold voltage of the first channel area (CH1) is the positive voltage.

Also, the second channel area corresponds to a P-type channel area. If the gate-source voltage (Vgs) has a negative voltage, the current value (Ids2) of the second channel area (CH2) has the P-type semiconductor properties which are raised in proportion to the gate-source voltage (Vgs). Therefore, the second channel area (CH2) may be turned on when a voltage difference between gate-source voltage (Vgs) and a threshold voltage of the second channel area (CH2) is the negative voltage.

Referring to FIG. 3, the saturation mobility of the current value (Ids1) is 7 cm2/Vs, and the saturation mobility of the current value (Ids2) is 4.5 cm2/Vs, whereby the thin film transistor according to the present disclosure including both the N-type semiconductor layer 131 and the P-type semiconductor layer 132 effectively provides both the N-type semiconductor properties and the P-type semiconductor properties.

As described above, according to one embodiment of the present disclosure, the overlapping area between the N-type semiconductor layer 131 of the semiconductor layer 130 and the first gate electrode 110, which is disposed between the first source electrode 141 and the first drain electrode 142, may be defined as the first channel area (CH1), and the overlapping area between the P-type semiconductor layer 132 of the semiconductor layer 130 and the second gate electrode 160, which is disposed between the second source electrode 143 and the second drain electrode 144, may be defined as the second channel area (CH2). As a result, it is possible to provide the first channel area (CH1) having the N-type semiconductor properties and the second channel area (CH2) having the P-type semiconductor properties.

Figure 4:
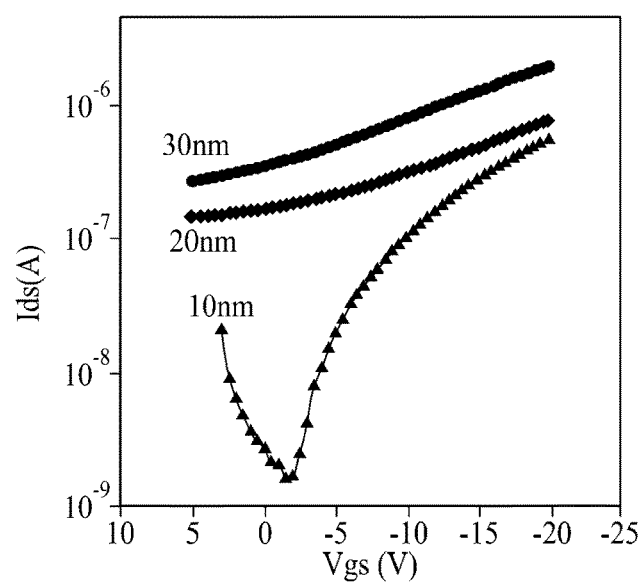
FIG. 4 is a graph showing the P-type semiconductor properties in accordance with a thickness of a P-type semiconductor layer according to one embodiment of the present disclosure.

FIG. 4 is a graph showing the P-type semiconductor properties in accordance with the thickness of the P-type semiconductor layer. FIG. 4 shows the current value (Ids2) of the second channel area (CH2) in accordance with the gate-source voltage (Vgs), on assumption that a drain-source voltage is −20V, when the thickness of the P-type semiconductor layer 132 is 10 nm, 20 nm, or 30 nm. In FIG. 4, the X-axis indicates the gate-source voltage (Vgs), and the Y-axis indicates the current value (Ids) of the second channel area (CH2).

Referring to FIG. 4, when the thickness of the P-type semiconductor layer 132 is 20 nm or 30 nm, the current continuously flows despite the change in the gate-source voltage (Vgs), so that it is difficult to realize the P-type semiconductor properties. That is, when the thickness of the P-type semiconductor layer 132 is 20 nm or 30 nm, the P-type semiconductor layer 132 does not have the P-type semiconductor properties Meanwhile, if the thickness of the P-type semiconductor layer 132 is 10 nm, the off-current properties is shown when the gate-source voltage (Vgs) is near 0V. That is, if the thickness of the P-type semiconductor layer 132 is 10 nm, it is possible to realize the P-type semiconductor properties.

Therefore, the thin film transistor 10 according to one embodiment of the present disclosure may realize the P-type semiconductor properties when the thickness of the P-type semiconductor layer 132 may be smaller than the thickness of the N-type semiconductor layer 131.

Figure 5:
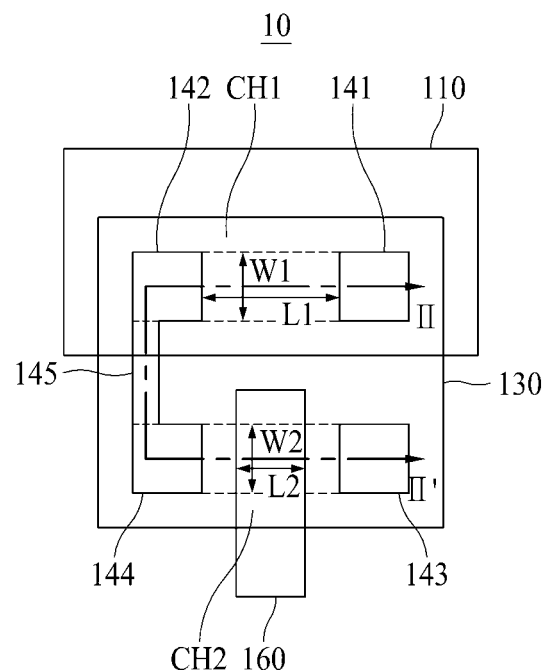
FIG. 5 is a plane view illustrating a thin film transistor according to another embodiment of the present disclosure.
Figure 6:
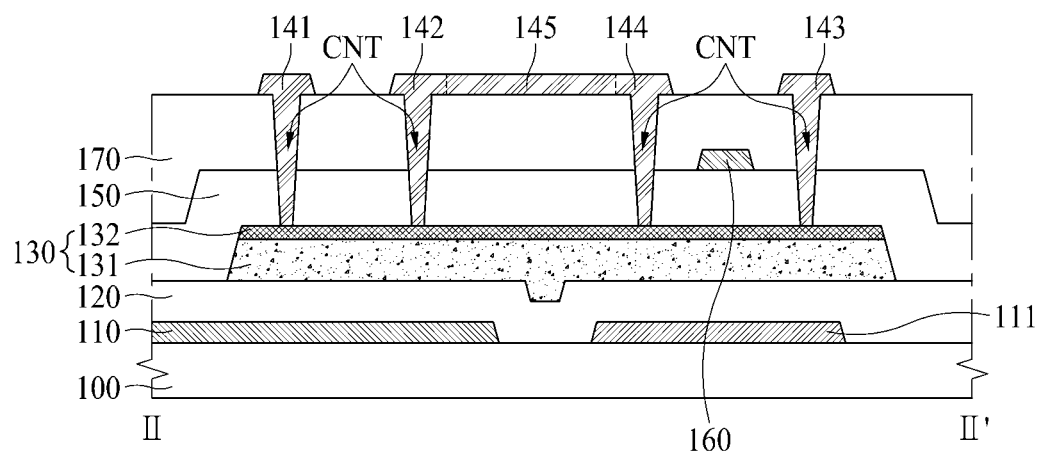
FIG. 6 is a cross sectional view along II-II' line of FIG. 5 according to one embodiment of the present disclosure.

FIG. 5 is a plan view illustrating a thin film transistor according to another embodiment of the present disclosure. FIG. 6 is a cross sectional view along II-II′ line of FIG. 5.

Referring to FIGS. 5 and 6, the thin film transistor 10 according to another embodiment of the present disclosure may include a first gate electrode 110, a semiconductor layer 130, a first source electrode 141, a first drain electrode 142, a second source electrode 143, a second drain electrode 144, and a second gate electrode 160.

The first gate electrode 110, a light-shielding layer 111, and a semiconductor layer 130 included in the thin film transistor 10 shown in FIGS. 5 and 6 are identical to the first gate electrode 110, the light-shielding layer 111, and the semiconductor layer 130 shown in FIGS. 1 and 2, whereby a detailed description for the first gate electrode 110, the light-shielding layer 111, and the semiconductor layer 130 will be omitted.

A second gate insulating film 150 may be provided on the semiconductor layer 130. The second gate insulating film 150 may be formed in a single-layered structure of an inorganic film such as silicon oxide (SiOx) or silicon nitride (SiNx), or a multi-layered structure of inorganic films such as silicon oxide (SiOx) and silicon nitride (SiNx).

The second gate electrode 160 may be provided on the second gate insulating film 150. The second gate electrode 160 may be overlapped with the second source electrode 143 and the second drain electrode 144. The second gate electrode 160 may be formed in a single-layered structure of any one selected among molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys.

The first gate electrode 110 may be partially overlapped with a portion of the semiconductor layer 130, and the second gate electrode 160 may be partially overlapped with another portion of the semiconductor layer 130.

An insulating interlayer 170 may be provided on the second gate electrode 160. The insulating interlayer 170 may be formed in a single-layered structure of an inorganic film such as silicon oxide (SiOx) or silicon nitride (SiNx), or a multi-layered structure of inorganic films such as silicon oxide (SiOx) and silicon nitride (SiNx).

The first and second source electrodes 141 and 143, and the first and second drain electrodes 142 and 144 may be provided on the insulating interlayer 170. The first and second source electrodes 141 and 143, and the first and second drain electrodes 142 and 144 may be connected with a P-type semiconductor layer 132 of the semiconductor layer 130 via a contact hole (CNT) penetrating through the second gate insulating film and the insulating interlayer 170.

The first source and drain electrodes 141 and 142 may be overlapped with the first gate electrode 110. The second source and drain electrodes 143 and 144 may not be overlapped with the second gate electrode 120.

The first drain electrode 142 may be connected with the second drain electrode 144 via a connection electrode 145. In this case, the thin film transistor 10 may function as a complementary metal oxide semiconductor (CMOS). It is possible to omit the connection electrode 145.

Meanwhile, an overlapping area between an N-type semiconductor layer 131 of the semiconductor layer 130 and the first gate electrode 110, which is disposed between the first source electrode 141 and the first drain electrode 142, may be defined as a first channel area (CH1) having the N-type semiconductor properties. A channel length (L1) of the first channel area (CH1) may be defined by a distance between the first source electrode 141 and the first drain electrode 142. A channel width (W1) of the first channel area (CH1) may be defined by a width of each of the first source and drain electrodes 141 and 142.

Also, an overlapping area between the P-type semiconductor layer 132 of the semiconductor layer 130 and the second gate electrode 160, which is disposed between the second source electrode 143 and the second drain electrode 144, may be defined as a second channel area (CH2) having the P-type semiconductor properties. In this case, a channel length (L2) of the second channel area (CH2) may be defined by a distance between the second source electrode 143 and the second drain electrode 144. A channel width (W2) of the second channel area (CH2) may be defined by a width of each of the second source and drain electrodes 143 and 144.

As described above, the thin film transistor 10 according to another embodiment of the present disclosure includes both the N-type semiconductor layer 131 and the P-type semiconductor layer 132 so that it is possible to provide the first channel area (CH1) corresponding to the overlapping area between the N-type semiconductor layer 131 and the first gate electrode 110, which is disposed in the area between the first source electrode 141 and the first drain electrode 142, and also to provide the second channel area (CH2) corresponding to the overlapping area between the P-type semiconductor layer 132 and the second gate electrode 160, which is disposed in the area between the second source electrode 143 and the second drain electrode 144. As a result, it is possible to realize the thin film transistor having both the N-type semiconductor properties and the P-type semiconductor properties.

That is, as shown in FIGS. 5 and 6, the thin film transistor 10 according to another embodiment of the present disclosure is provided with the first channel area (CH1) having the N-type semiconductor properties, and the second channel area (CH2) having the P-type semiconductor properties.

According to another embodiment of the present disclosure, as shown in FIG. 4, the thickness of the P-type semiconductor layer 132 is 10 nm or less than 10 nm so as to control a turning on/off operation of the second channel area (CH2), preferably.

FIG. 7 is a flow chart illustrating a method for manufacturing the thin film transistor according to one embodiment of the present disclosure. FIGS. 8A to 8F are cross sectional views along I-I' line of FIG. 1, which illustrate the method for manufacturing the thin film transistor according to one embodiment of the present disclosure. The cross sectional views shown in FIGS. 8A to 8F relate to the method for manufacturing the thin film transistor shown in FIGS. 1 and 2, whereby the same reference numbers will be used throughout the drawings to refer to the same or like parts. Hereinafter, the method for manufacturing the thin film transistor according to one embodiment of the present invention will be described in detail with reference to FIG. 7 and FIGS. 8A to 8F.

Figure 8A:
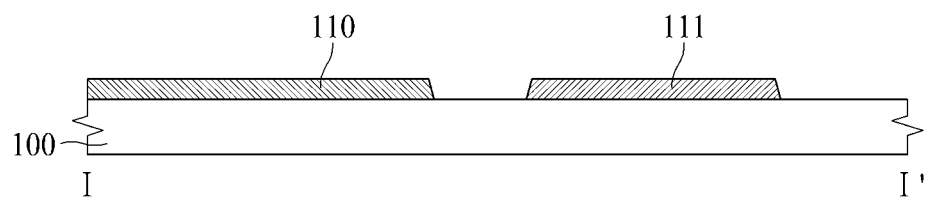
FIGS. 8A to 8F are cross sectional views along I-I' line of FIG. 7, which illustrate the method for manufacturing the thin film transistor according to one embodiment of the present disclosure.

First, as shown in FIG. 8A, the first gate electrode 110 is provided on the substrate 100 (S101). In detail, a first metal layer is provided on the entire upper surface of the substrate 100 by a sputtering method. Then, a photoresist pattern is provided on the first metal layer, and a mask process for etching the first metal layer is carried to pattern the first metal layer, to thereby provide the first gate electrode 110. The first gate electrode 110 may be formed in a single-layered structure of any one selected among molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys.

The buffer film for protecting the thin film transistor 10 from moisture permeating through the substrate 100 is provided on the substrate 100. The first gate electrode 110 may be provided on the buffer film. The buffer film may be formed of a plurality of inorganic films alternately deposited. For example, the buffer film may be formed in a multi-layered structure obtained by alternately depositing at least one inorganic films among silicon oxide (SiOx), silicon nitride (SiNx), and silicon oxinitride (SiON). The buffer film may be provided by a plasma enhanced chemical vapor deposition (PECVD) method ('S101' of FIG. 7).

Figure 8B:
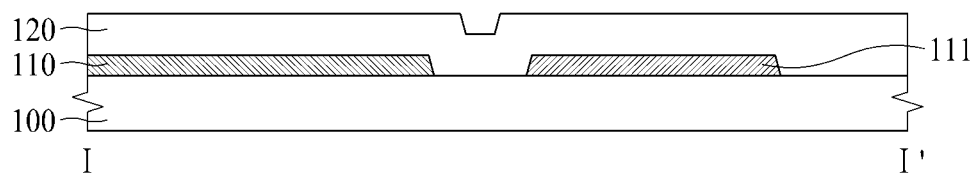

Secondly, as shown in FIG. 8B, the first gate insulating film 120 may be provided on the first gate electrode 110 (S102). The first gate insulating film 120 may be formed in a single-layered structure of an inorganic film such as silicon oxide (SiOx) or silicon nitride (SiNx), or a multi-layered structure of inorganic films such as silicon oxide (SiOx) and silicon nitride (SiNx). The first gate insulating film 120 may be provided by a plasma enhanced chemical vapor deposition (PECVD) method ('S102' of FIG. 7).

Figure 8C:
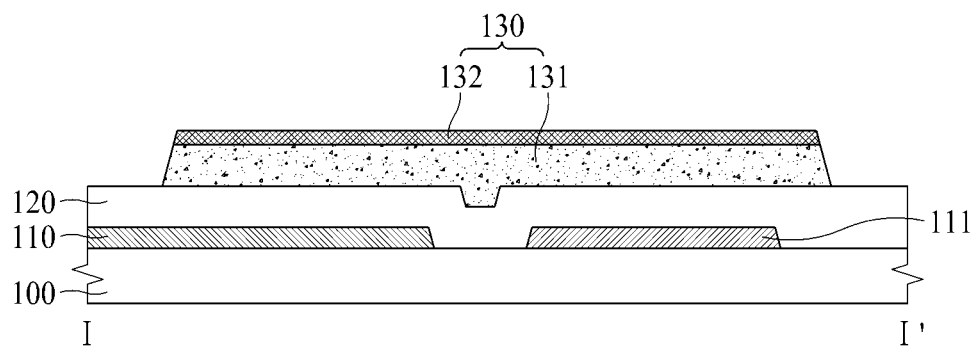

Thirdly, as shown in FIG. 8C, the semiconductor layer 130 may be provided on the first gate insulating film 120 (S103). The semiconductor layer 130 may include the N-type semiconductor layer 131, and the P-type semiconductor layer 132.

First, a first semiconductor layer is provided on the entire upper surface of the first gate insulating film 120 by a sputtering method or a metal organic chemical vapor deposition (MOCVD) method, and then a second semiconductor layer is provided on the entire upper surface of the first semiconductor layer. Thereafter, the first semiconductor layer and the semiconductor layer are patterned at the same time by a mask process using a photoresist pattern, to thereby provide the N-type semiconductor layer 131 and the P-type semiconductor layer 132. A portion of the semiconductor layer 130 may be overlapped with the first gate electrode 110.

The N-type semiconductor layer 131 may be formed of the N-type poly silicon layer or the N-type oxide semiconductor layer. If the N-type semiconductor layer 131 is formed of the N-type oxide semiconductor layer, it may be IGZO, IZO, IGO, ITZO, GTO, ZTO, IAZO, AZO, ITO, ATO, or GZO.

The P-type semiconductor layer 132 may be formed of the P-type poly silicon layer or the P-type oxide semiconductor layer. If the P-type semiconductor layer 132 is formed of the P-type oxide semiconductor layer, it may be $Cu_2O$, SnO, NiO, $CuMO_2$ (Delafossite, M=Al, Ga, In, Sr, Y, Sc, Cr), $ZnM_2O_4$ (Spinel, M=Co, Rh, Ir), Ln/Cu/O/Ch (oxychalcogenide, Ln=lanthanoids (La~Lu), Ch=Se, S, Te), or Cu-Nanowire.

Hereinafter, the P-type semiconductor layer 132 using $Cu_2O$ will be described in detail as follows.

If the P-type semiconductor layer 132 is formed of $Cu_2O$, in order to provide the thin film transistor 10 having the N-type semiconductor properties and the P-type semiconductor properties, the N-type semiconductor layer 131 and the P-type semiconductor layer 132 are manufactured while being maintained under a vacuum state. That is, the N-type semiconductor layer 131 and the P-type semiconductor layer 132 are sequentially deposited while being maintained under the vacuum state within one chamber. For example, when manufacturing the N-type semiconductor layer 131 and the P-type semiconductor layer 132, it is maintained at the vacuum state of 5 mTorr~10 mTorr.

If the vacuum state is not maintained for the process of manufacturing the N-type semiconductor layer 131 and the P-type semiconductor layer 132, the N-type semiconductor layer 131 may be oxidized by oxygen of the atmosphere, whereby an interface between the N-type semiconductor layer 131 and the P-type semiconductor layer 132 may be unstable.

The P-type semiconductor layer 132 may be manufactured under the condition that an oxygen partial pressure is 3% or less than 3%. If the oxygen partial pressure is more than 3%, the P-type semiconductor layer 132 may be formed of not $Cu_2O$ but CuO. Also, if the vacuum state is not maintained for the process of manufacturing the N-type semiconductor layer 131 and the P-type semiconductor layer 132, the P-type semiconductor layer 132 may be formed of not $Cu_2O$ but CuO due to oxygen of the atmosphere.

Figure 9:
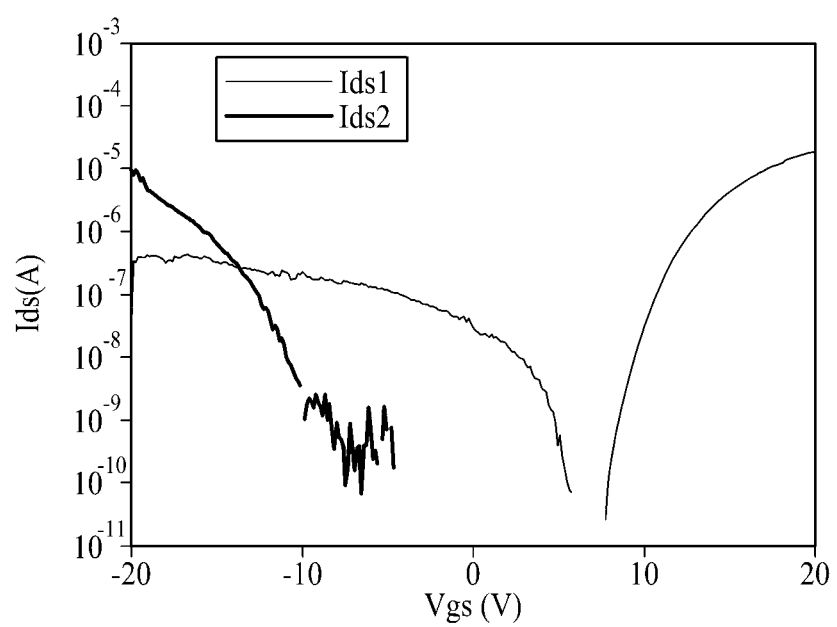
FIG. 9 is a graph illustrating the N-type semiconductor properties and the P-type semiconductor properties when a vacuum brake exists for a process of manufacturing N-type and P-type semiconductor layers according to one embodiment of the present disclosure.

If the P-type semiconductor layer 132 is formed of CuO, an electron mobility is largely lowered in comparison to the P-type semiconductor layer of $Cu_2O$. That is, if the P-type semiconductor layer 132 is formed of CuO, an electron mobility of the second channel area (CH2) is very low, for example, the electron mobility of the second channel area (CH2) is 1 cm2/Vs or less than 1 cm2/Vs. In this case, as shown in FIG. 9, the P-type semiconductor properties of the thin film transistor 10 may be lowered largely so that it is difficult to provide the P-type semiconductor properties by the use of second channel area (CH2).

Also, a heat treatment using a high temperature may be carried out so as to change the P-type semiconductor layer of CuO into the P-type semiconductor layer of $Cu_2O$. For example, the P-type semiconductor layer 132 of CuO is treated by the heat treatment above 300° C. for at least 30 minutes under the vacuum state. However, if carrying out the heat treatment under the vacuum state, a conductivity of the N-type semiconductor layer 131 is increased due to an oxygen desorption, as shown in FIG. 9, which causes a problem relating the increase of off-current.

The N-type semiconductor layer 131 may be manufactured at the oxygen-rich atmosphere. For example, when manufacturing the N-type semiconductor layer 131, an oxygen partial pressure may be 3%~10%. However, if it is needed to improve the electron mobility in accordance with the material of the N-type semiconductor layer 131, the oxygen partial pressure for the N-type semiconductor layer 131 may be 0%~3%.

Meanwhile, as described above, if the P-type semiconductor layer 132 is manufactured to be $Cu_2O$, the oxygen partial pressure is 0%~3%. However, if manufacturing the P-type semiconductor layer 132 by the use of oxygen reaction with a targeted copper, the oxygen partial pressure is 40% or more than 40%.

In one embodiment, the thickness of the N-type semiconductor layer 131 is 30 nm or less than 30 nm so as to improve the electron mobility. Also, the thickness of the P-type semiconductor layer 132 is 10 nm or less than 10 nm so as to control the turning on/off operation of the second channel area (CH2), and to facilitate the process of manufacturing the P-type semiconductor layer 132 of $Cu_2O$. Accordingly, the thickness of the P-type semiconductor layer 132 is 10 nm or less than 10 nm ('S103' of FIG. 7).

Figure 8D:
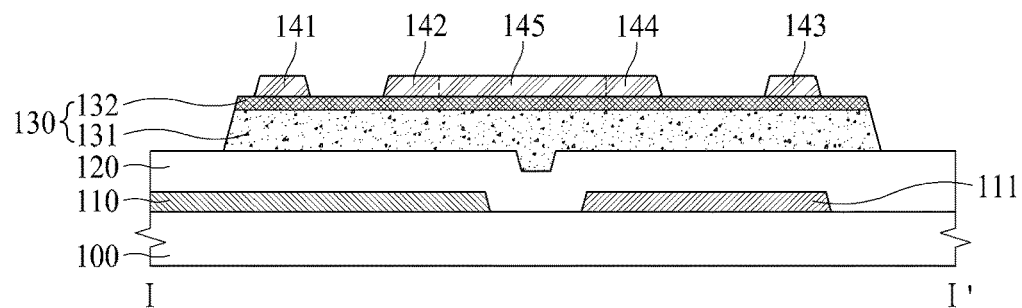

Fourthly, as shown in FIG. 8D, the first and second source electrodes 141 and 143, and the first and second drain electrodes 142 and 144 may be provided on the semiconductor layer 130 (S104). In detail, a second metal layer is provided on the entire upper surface of the semiconductor layer 130 by a sputtering method or a metal oxide chemical vapor deposition (MOCVD) method. Then, the second metal layer is patterned by a mask process using a photoresist pattern, to thereby provide the first and second source electrodes 141 and 143, and the first and second drain electrodes 142 and 144. The first source electrode 141 and the first drain electrode 142 may be overlapped with the first gate electrode 110.

Also, the connection electrode 145 may be provided so as to connect the first and second drain electrodes 142 and 144 with each other. In this case, the thin film transistor 10 may function as a complementary metal oxide semiconductor (CMOS). It is possible to omit the connection electrode 145.

The first and second source electrodes 141 and 143, the first and second drain electrodes 142 and 144, and the connection electrode 145 may be formed in a single-layered structure of any one selected among molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys. However, since the first and second source electrodes 141 and 143, and the first and second drain electrodes 142 and 144 are in contact with the P-type semiconductor layer 132, preferably, the first and second source electrodes 141 and 143, the first and second drain electrodes 142 and 144, and the connection electrode 145 may be formed in a single-layered structure or multi-layered structure selected from materials whose work functions are 5.0 eV or more than 5.0 eV, for example, palladium (Pd, 5.22 eV~5.6 eV), platinum (Pt, 5.12 eV~5.93 eV), aurums (Au, 5.1 eV~5.47 eV), nickel (Ni, 5.04 eV~5.35 eV), and their alloys ('S104' of FIG. 7).

Figure 8E:
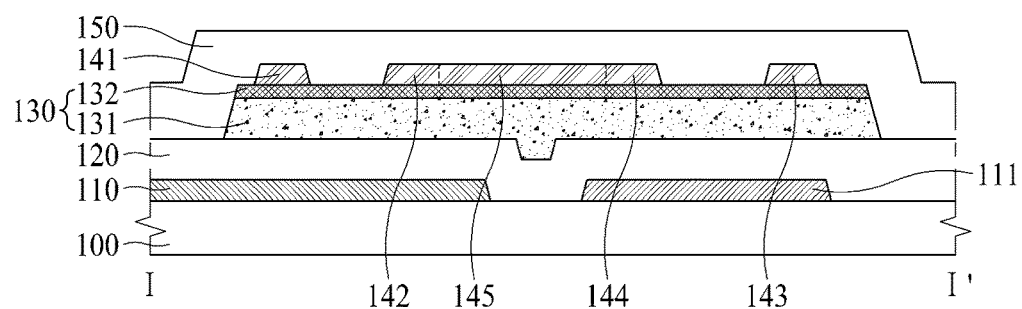

Fifthly, as shown in FIG. 8E, the second gate insulating film 150 may be provided on the semiconductor layer 130, the first and second source electrodes 141 and 143, the first and second drain electrodes 142 and 144, and the connection electrode 145 (S105). The second gate insulating film 150 may be formed in a single-layered structure of an inorganic film such as silicon oxide (SiOx) or silicon nitride (SiNx), or a multi-layered structure of inorganic films such as silicon oxide (SiOx) and silicon nitride (SiNx). The second gate insulating film 150 may be provided by a plasma enhanced chemical vapor deposition (PECVD) method ('S105' of FIG. 7).

Figure 8F:
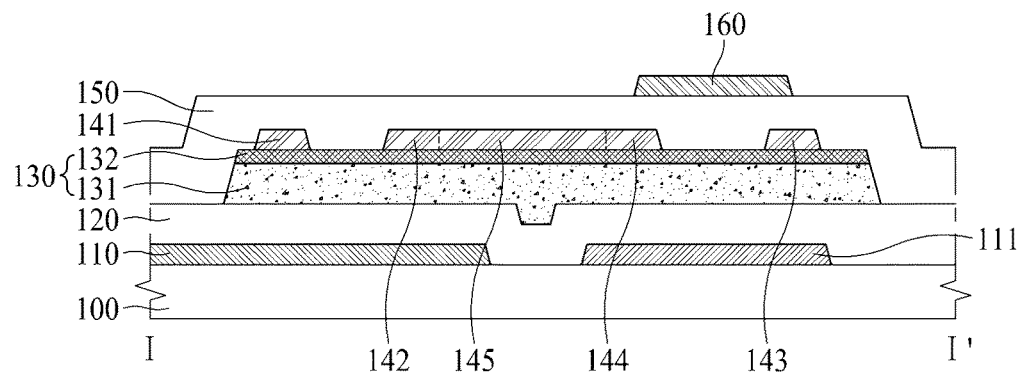

Sixthly, as shown in FIG. 8F, the second gate electrode 160 may be provided on the second gate insulating film 150 (S106). In detail, a third metal layer is provided on the entire upper surface of the second gate insulating film 150 by a sputtering method and a metal organic chemical vapor deposition (MOCVD) method. Then, the third metal layer is patterned by a mask process using a photoresist pattern, to thereby provide the second gate electrode 160. The second gate electrode 160 may be formed in a single-layered structure of any one selected among molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys.

The second gate electrode 160 may be overlapped with the second source electrode 143 and the second drain electrode 144. If the first gate electrode 110 is overlapped with a portion of the semiconductor layer 130, the second gate electrode 160 may be overlapped with another portion of the semiconductor layer 130 ('S106' of FIG. 7).

As described above, the N-type semiconductor layer 131 and the P-type semiconductor layer 132 are sequentially deposited under the vacuum state within one chamber. As a result, it is possible to provide the stable interface between the N-type semiconductor layer 131 and the P-type semiconductor layer 132. Also, the P-type semiconductor layer 132 is manufactured at the oxygen partial pressure of 0%~3%. As a result, it is possible to provide the P-type semiconductor layer 132 of Cu2O instead of CuO. Accordingly, it is possible to realize the thin film transistor having the N-type semiconductor properties and the P-type semiconductor properties.

FIG. 10 is a flow chart illustrating a method for manufacturing the thin film transistor according to another embodiment of the present disclosure. FIGS. 11A to 11D are cross sectional views along II-II' line of FIG. 5, which illustrate the method for manufacturing the thin film transistor according to another embodiment of the present disclosure. The cross sectional views shown in FIGS. 11A to 11D relate to the method for manufacturing the thin film transistor shown in FIGS. 5 and 6, whereby the same reference numbers will be used throughout the drawings to refer to the same or like parts. Hereinafter, the method for manufacturing the thin film transistor according to another embodiment of the present invention will be described in detail with reference to FIGS. 10 and 11A to 11D.

The steps 'S201' to 'S203' of FIG. 10 are the same as the steps of 'S101' to 'S103' of FIG. 7, whereby a detailed description for the steps 'S201' to 'S203' of FIG. 10 will be omitted.

Figure 11A:
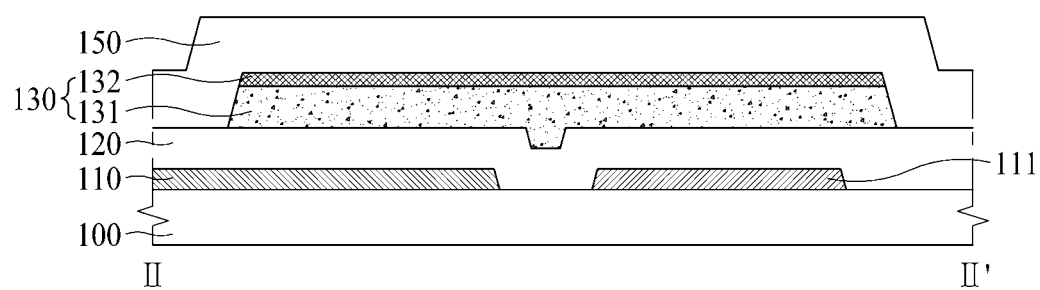
FIGS. 11A to 11D are cross sectional views along I-I' line of FIG. 7, which illustrate the method for manufacturing the thin film transistor according to another embodiment of the present disclosure.

Referring to FIG. 10, fourthly, as shown in FIG. 11A, the second gate insulating film 150 may be provided on the semiconductor layer 130 (S204). The second gate insulating film 150 may be formed in a single-layered structure of an inorganic film such as silicon oxide (SiOx) or silicon nitride (SiNx), or a multi-layered structure of inorganic films such as silicon oxide (SiOx) and silicon nitride (SiNx). The second gate insulating film 150 may be provided by a plasma enhanced chemical vapor deposition (PECVD) method ('S204' of FIG. 10).

Figure 11B:
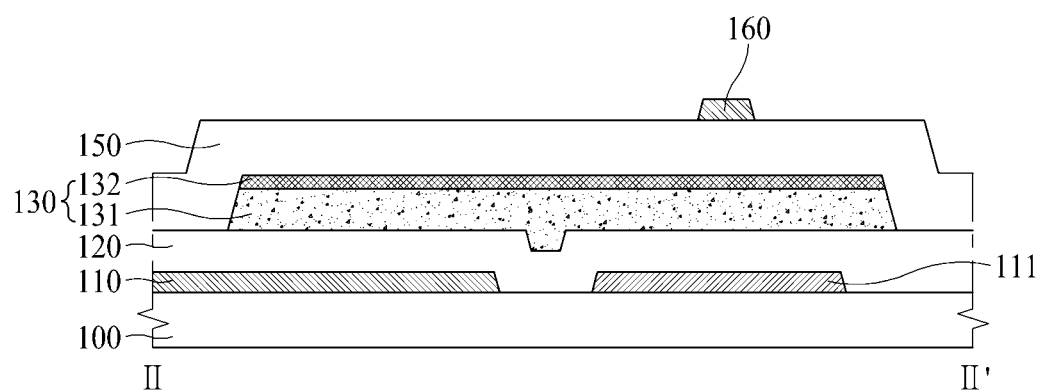

Fifthly, as shown in FIG. 11B, the second gate electrode 160 may be provided on the second gate insulating film 150 (S205). In detail, a second metal layer is provided on the entire upper surface of the second gate insulating film 150 by a sputtering method or a metal oxide chemical vapor deposition (MOCVD) method. Then, the second metal layer is patterned by a mask process using a photoresist pattern, to thereby provide the second gate electrode 160. The second gate electrode 160 may be formed in a single-layered structure of any one selected among molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys.

If the first gate electrode 110 is overlapped with a portion of the semiconductor layer 130, the second gate electrode 160 is overlapped with another portion of the semiconductor layer 130 ('S205' of FIG. 10).

Figure 11C:
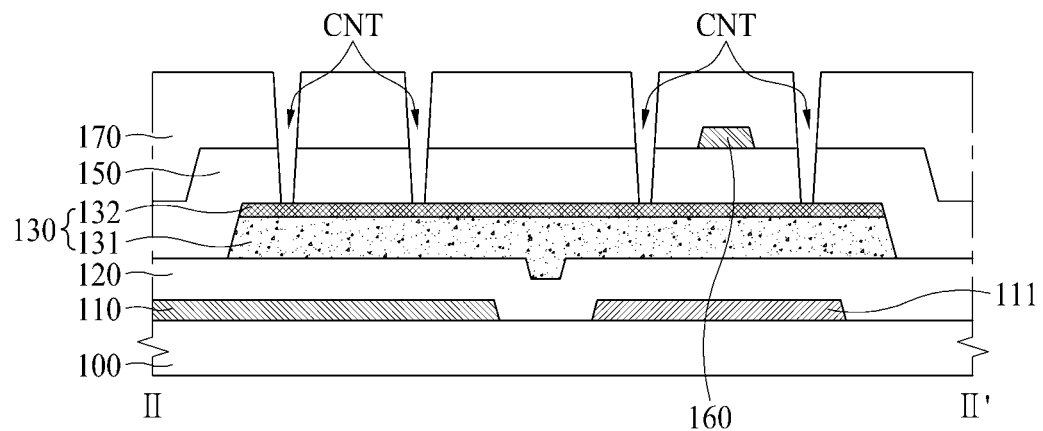

Sixthly, as shown in FIG. 11C, the insulating interlayer 170 may be provided on the second gate electrode 160 (S206). The insulating interlayer 170 may be formed in a single-layered structure of an inorganic film such as silicon oxide (SiOx) or silicon nitride (SiNx), or a multi-layered structure of inorganic films such as silicon oxide (SiOx) and silicon nitride (SiNx). The insulating interlayer 170 may be provided by a plasma enhanced chemical vapor deposition (PECVD) method.

Thereafter, the contact holes penetrating through the second gate insulating film 150 and the insulating interlayer 170 may be provided so as to expose the P-type semiconductor layer 132 of the semiconductor layer 130 ('S206' of FIG. 10).

Figure 11D:
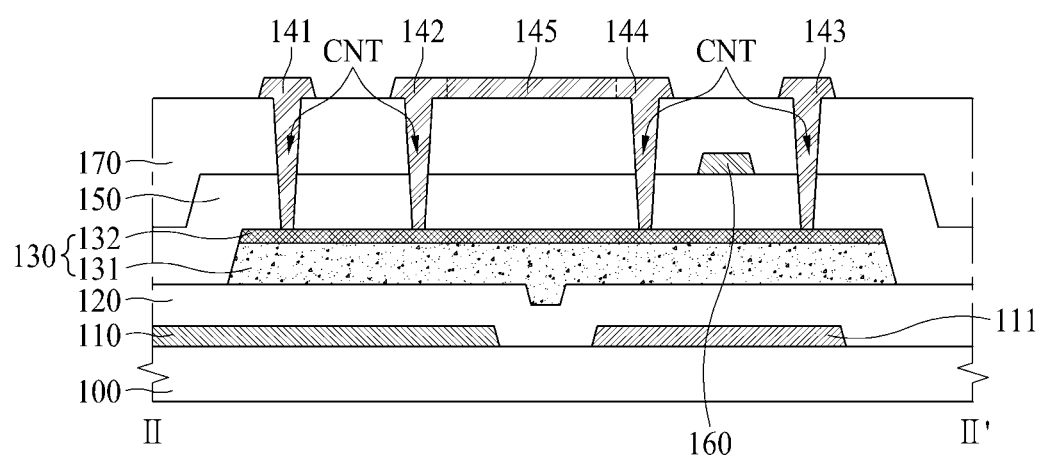

Seventhly, as shown in FIG. 11D, the first and second source electrodes 141 and 143, and the first and second drain electrodes 142 and 144 may be provided on the insulating interlayer 170 (S207). In detail, a third metal layer is provided on the entire upper surface of the insulating interlayer 170 by a sputtering method and a metal organic chemical vapor deposition (MOCVD) method. Then, the third metal layer is patterned by a mask process using a photoresist pattern, to thereby provide the first and second source electrodes 141 and 143, and the first and second drain electrodes 142 and 144. The first and second source electrodes 141 and 143, and the first and second drain electrodes 142 and 144 may be connected with the P-type semiconductor layer 132 of the semiconductor layer 130 through the contact holes (CNT).

The first source electrode 141 and the first drain electrode 142 may be overlapped with the first gate electrode 110. The second source electrode 143 and the second drain electrode 144 may not be overlapped with the second gate electrode 120.

Also, the connection electrode 145 may be provided so as to connect the first and second drain electrodes 142 and 144 with each other. In this case, the thin film transistor 10 may function as a complementary metal oxide semiconductor (CMOS). It is possible to omit the connection electrode 145.

The first and second source electrodes 141 and 143, the first and second drain electrodes 142 and 144, and the connection electrode 145 may be formed in a single-layered structure of any one selected among molybdenum (Mo), aluminum (Al), chrome (Cr), aurums (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurums (Au), titanium (Ti), nickel (Ni), neodymium (Nd), copper (Cu), and their alloys. However, since the first and second source electrodes 141 and 143, and the first and second drain electrodes 142 and 144 are in contact with the P-type semiconductor layer 132, preferably, the first and second source electrodes 141 and 143, the first and second drain electrodes 142 and 144, and the connection electrode 145 may be formed in a single-layered structure or multi-layered structure selected from materials whose work functions are 5.0 eV or more than 5.0 eV, for example, palladium (Pd, 5.22 eV~5.6 eV), platinum (Pt, 5.12 eV~5.93 eV), aurums (Au, 5.1 eV~5.47 eV), nickel (Ni, 5.04 eV~5.35 eV), and their alloys ('S207' of FIG. 10).

Figure 12:
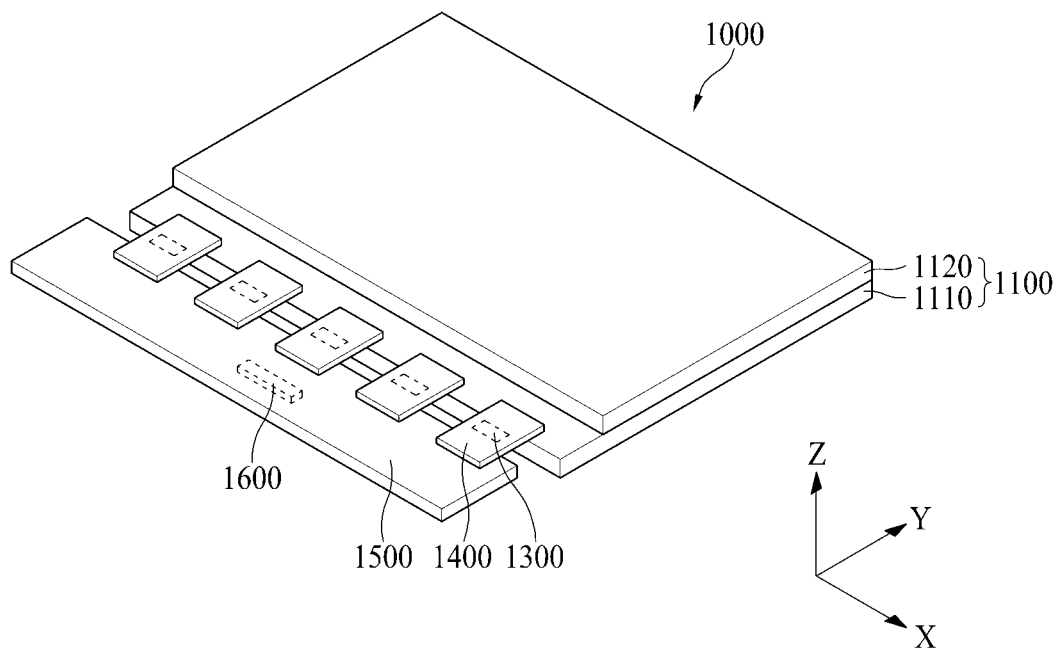
FIG. 12 is a perspective view illustrating a display device according to one embodiment of the present disclosure.
Figure 13:
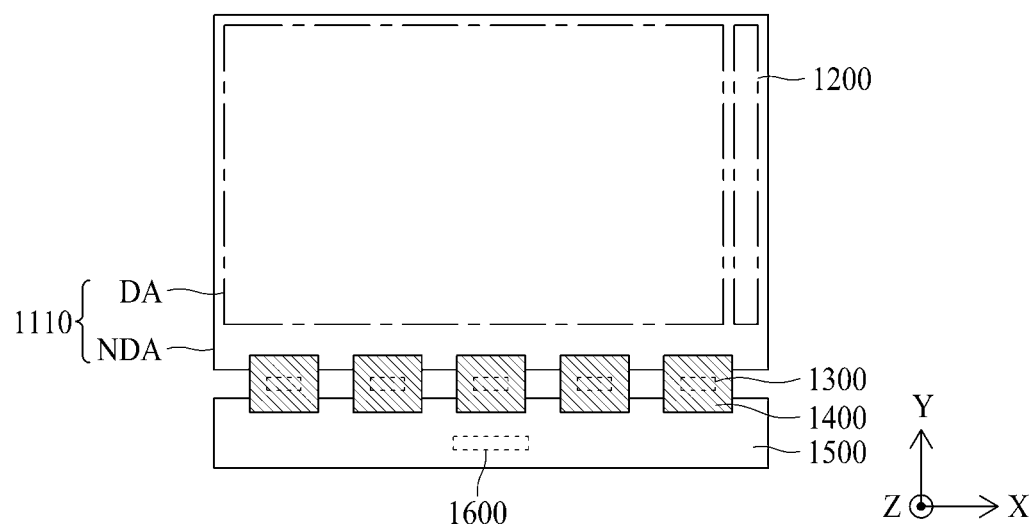
FIG. 13 is a plan view illustrating a first substrate, a gate driver, a source drive IC, a flexible film, a circuit board, and a timing controller of FIG. 12 according to one embodiment of the present disclosure.

FIG. 12 is a perspective view illustrating a display device according to one embodiment of the present disclosure. FIG. 13 is a plan view illustrating a first substrate, a gate driver, a source drive IC, a flexible film, a circuit board, and a timing controller of FIG. 12.

Referring to FIGS. 12 and 13, an organic light emitting display device 1000 according to one embodiment of the present disclosure may include a display panel 1100, a gate driver 1200, a source drive integrated circuit (hereinafter, referred to as "source drive IC") 1300, a flexible film 1400, a circuit board 1500, and a timing controller 1600. The display device according to one embodiment of the present invention may be realized as one of a liquid crystal display device, an organic light emitting display device, a field emission display device, and an electrophoresis display device.

The display panel 1100 may include a first substrate 1110 and a second substrate 1120. The second substrate 1120 may be an encapsulation substrate. The first substrate 1110 and the second substrate 1120 may be formed of plastic or glass.

On one surface of the first substrate 1110 confronting the second substrate 1120, there are gate lines, data lines, and pixels. The pixels are provided in areas defined by crossing the gate lines with the data lines. A structure of each pixel will be described in detail with reference to FIGS. 14 to 16.

As shown in FIG. 13, the display panel 1110 may include a display area (DA) provided with the pixels for displaying an image, and a non-display area (NDA) in which an image is not displayed. The gate lines, the data lines, and the pixels may be provided in the display area (DA), and the gate driver 1200 and pads may be provided in the non-display area (NDA).

The gate driver 1200 supplies gate signals to the gate lines in accordance with a gate control signal which is input from the timing controller 1600. The gate driver 1200 may be provided in one side of the display area (DA) of the display panel 1100, or the non-display area (NDA) of both peripheral sides of the display panel 1100 by a gate driver in panel (GIP) method. If the gate driver 1200 is provided in the GIP method, the gate driver 1200 will be described in detail with reference to FIG. 17. In another way, the gate driver 1200 may be manufactured in a driving chip, may be mounted on the flexible film, and may be attached to one side of the display area (DA) of the display panel 1100, or the non-display area (NDA) of both peripheral sides of the display panel 1100 by a tape automated bonding (TAB) method.

The source drive IC 1300 receives digital video data and source control signals. The source drive IC 1300 converts the digital video data into analog data voltages in accordance with the source control signal, and supplies the analog data voltages to the data lines. If the source drive IC 1300 is manufactured in a driving chip, the source drive IC 1300 may be mounted on the flexible film 1400 by a chip on film (COF) method or a chip on plastic (COP) method.

The pads such as data pads may be provided in the non-display area (NDA) of the display panel 1100. In the flexible film 1400, there are lines for connecting the pads with the source drive IC 1300, and lines for connecting the pads with the lines of the circuit board 1500. The flexible film 1400 is attached to the pads by the use of anisotropic conducting film, whereby the pads may be connected with the lines of the flexible film 1400.

The circuit board 1500 may be attached to the flexible film 1400. A plurality of circuits, which are realized in a plurality of driving chips, may be mounted on the circuit board 1500. For example, the timing controller 1600 may be mounted on the circuit board 1500. The circuit board 1500 may be a printed circuit board or a flexible printed circuit board.

The timing controller 1600 receives digital video data and a timing signal from an external system board via a cable of the circuit board 1500. The timing controller 1600 generates the gate control signal for controlling an operation timing of the gate driver 1200 and the source control signal for controlling the source drive IC 1300 on the basis of the timing signal. The timing controller 1600 supplies the gate control signal to the gate driver 1200, and supplies the source control signal to the source drive IC 1300.

Figure 14:
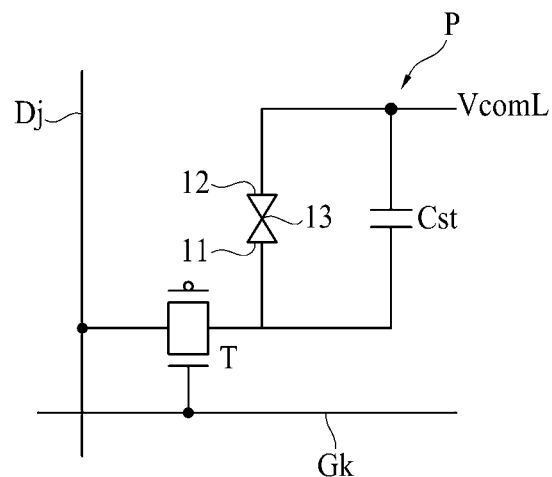
FIG. 14 is a circuit diagram illustrating one example of a pixel in the display device according to the embodiment of the present disclosure.

FIG. 14 is a circuit diagram illustrating one example of the pixel in the display device according to the embodiment of the present disclosure. Referring to FIG. 14, the pixel (P) of the display device according to the embodiment of the present disclosure may include a thin film transistor (T), a pixel electrode 11, a common electrode 12, and a storage capacitor (Cst).

The thin film transistor (T) supplies the data voltage of the j-th data line (Dj, 'j' is 2 or an integer above 2) to the pixel electrode 11 in response to the gate signal of the k-th gate line (Gk, 'k' is 2 or an integer above 2). Each of the pixels (P) drives liquid crystal of a liquid crystal layer 13 by an electric field generated based on a potential difference between the data voltage supplied to the pixel electrode 11 and a common voltage supplied to a common electrode 12 so that it is possible to adjust a transmittance amount of light which is emitted from a backlight unit. The common voltage is supplied to the common electrode 12 through a common voltage line (VcomL), and the backlight unit is disposed under the display panel 10 so as to emit uniform light to the display panel 10. Also, the storage capacitor (Cst) is prepared between the pixel electrode 11 and the common electrode 12, to thereby maintain a constant voltage difference between the pixel electrode 11 and the common electrode 12.

In the display device according to the embodiment of the present disclosure, any one of the first and second gate electrodes may be connected with the predetermined line or electrode so that it is possible to provide the thin film transistor (T) which is selectively realized in the N-type thin film transistor or the P-type thin film transistor. In FIG. 14, only the first gate electrode 110 of the thin film transistor (T) is connected with the k-th gate line (Gk), whereby the thin film transistor (T) is realized in the N-type thin film transistor.

Referring to FIG. 14, it needs the thin film transistor (T) having only the N-type semiconductor properties, whereby the connection between the j-th data line (Dj) and the pixel electrode 11 is switched by the use of first channel area (CH1) having the N-type semiconductor properties. Thus, the first gate electrode 110 of the thin film transistor (T) is connected with the k-th gate line (Gk), the first source electrode 141 is connected with the pixel electrode 11, and the first drain electrode 142 is connected with the j-th data line (Dj). The second gate electrode 160 of the thin film transistor (T) is not connected with any one line. The second source electrode 143 of the thin film transistor (T) may be connected with the j-th data line (Dj), and the second drain electrode 144 may be connected with the pixel electrode 11, but not limited to this structure. The second source electrode 143 and the second drain electrode 144 may not be electrically connected with any one line.

As described above, the thin film transistor according to the embodiment of the present disclosure has the N-type semiconductor properties and the P-type semiconductor properties. However, the thin film transistor according to the embodiment of the present disclosure uses only the N-type semiconductor properties, whereby the thin film transistor according to the embodiment of the present disclosure may be applied to the thin film transistor of the pixel (P) in the liquid crystal display device.

Meanwhile, FIG. 14 shows that the thin film transistor (T) uses only the N-type semiconductor properties. However, the thin film transistor (T) may use the N-type semiconductor properties and the P-type semiconductor properties. In this case, the second gate electrode 160 of the thin film transistor (T) may be connected with another signal line instead of the k-th gate line (Gk).

Figure 15:
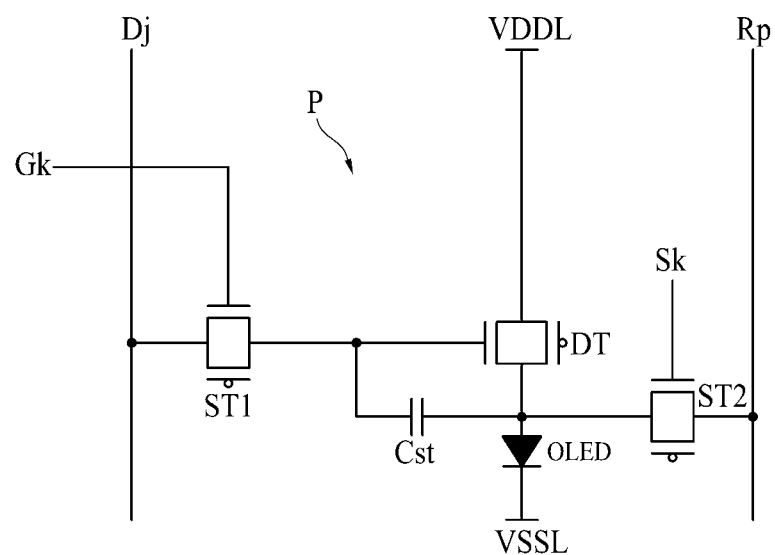
FIG. 15 is a circuit diagram illustrating another example of a pixel in the display device according to the embodiment of the present disclosure.

FIG. 15 is a circuit diagram illustrating another example of the pixel in the display device according to the embodiment of the present disclosure. Referring to FIG. 15, the pixel (P) of the display device according to the embodiment of the present invention may include an organic light emitting diode (OLED), a driving transistor (DT), first and second transistors (ST1, ST2), and a capacitor (Cst).

The organic light emitting diode (OLED) emits light in accordance with a current supplied through the driving transistor (DT). An anode electrode of the organic light emitting diode (OLED) may be connected with a source electrode of the driving transistor (DT), and a cathode electrode of the organic light emitting diode (OLED) may be connected with a first source voltage line (VSSL) supplied with a first source voltage. The first source voltage line (VSSL) may be a low potential voltage line supplied with a low potential source voltage.

The organic light emitting diode (OLED) may include the anode electrode, a hole transporting layer, an organic light emitting layer, an electron transporting layer, and the cathode electrode. When a voltage is applied to the anode electrode and the cathode electrode of the organic light emitting diode (OLED), hole and electron are respectively transferred to the organic light emitting layer through the hole transporting layer and the electron transporting layer, and a bond of the hole and electron in the organic light emitting layer makes a light emission.

The driving transistor (DT) is disposed between the organic light emitting diode (OLED) and a second source voltage line (VDDL) supplied with a second source voltage. The driving transistor (DT) adjusts a current flowing from the second source voltage line (VDDL) to the organic light emitting diode (OLED) in accordance with a voltage difference between the gate electrode and the source electrode. The second source voltage line (VDD) may be a high potential voltage line supplied with a high potential source voltage.

The first transistor (ST1) is turned-on by the k-th gate signal of the k-th gate line (Gk), to thereby supply the voltage of the j-th data line (Dj) to the gate electrode of the driving transistor (DT). The second transistor (ST2) is turned-on by the k-th sensing signal of the k-th sensing line (Sk), to thereby connect the q-th reference voltage line (Rq) with the source electrode of the driving transistor (DT).

The capacitor (Cst) is provided between the gate electrode and the source electrode of the driving transistor (DT). The capacitor (Cst) stores a differential voltage between the gate voltage and the source voltage of the driving transistor (DT).

In this embodiment of the present disclosure, any one of the first and second gate electrodes may be connected with the predetermined line or electrode so that it is possible to provide the thin film transistor (T) which is selectively realized in the N-type thin film transistor or the P-type thin film transistor. In FIG. 15, only the first gate electrode 110 of the thin film transistor (T) is connected with the predetermined line or electrode, whereby the thin film transistor (T) is realized in the N-type thin film transistor.

Referring to FIG. 15, the first gate electrode 110 of the driving transistor (DT) is connected with the first source electrode 141 of the first transistor (ST1), the first source electrode 141 is connected with the anode electrode of the organic light emitting diode (OLED), and the first drain electrode 142 is connected with the second source voltage line (VDDL). The second gate electrode 160 of the driving transistor (DT) is not connected with any one line, electrically. The second source electrode 143 of the driving transistor (DT) may be connected with the second source voltage line (VDDL), and the second drain electrode 144 may be connected with the anode electrode of the organic light emitting diode (OLED), but not limited to this structure. The second source electrode 143 and the second drain electrode 144 may not be electrically connected with any one line.

Also, the first gate electrode 110 of the first transistor (ST1) is connected with the k-th gate line (Gk), the first source electrode 141 is connected with the first gate electrode 110 of the driving transistor (DT), and the first drain electrode 142 is connected with the j-th data line (Dj). The second gate electrode 160 of the first transistor (ST1) is not electrically connected with any one line. The second source electrode 143 of the first transistor (ST1) may be connected with the j-th data line (Dj), and the second drain electrode 144 may be connected with the first gate electrode 110 of the driving transistor (DT), but not limited to this structure. The second source electrode 143 and the second drain electrode 144 may not be electrically connected with any one line.

Also, the first gate electrode 110 of the second transistor (ST2) is connected with the k-th sensing line (Sk), the first source electrode 141 is connected with the q-th reference voltage line (Rq), and the first drain electrode 142 is connected with the first source electrode 141 of the driving transistor (DT). The second gate electrode 160 of the second transistor (ST2) is not electrically connected with any one line. The second source electrode 143 of the second transistor (ST2) may be connected with the first source electrode 141 of the driving transistor (DT), and the second drain electrode 144 may be connected with the q-th reference voltage line (Rq), but not limited to this structure. The second source electrode 143 and the second drain electrode 144 may not be electrically connected with any one line.

As described above, the thin film transistor according to the embodiment of the present disclosure has the N-type semiconductor properties and the P-type semiconductor properties. However, the thin film transistor according to the embodiment of the present invention uses only the N-type semiconductor properties, whereby the thin film transistor according to the embodiment of the present disclosure may be applied to the thin film transistor of the pixel (P) in the organic light emitting display device.

Meanwhile, FIG. 15 shows that the driving transistor (DT) and the first and second transistors (ST1, ST2) use only the N-type semiconductor properties. However, the thin film transistor (T) may use the N-type semiconductor properties and the P-type semiconductor properties. In this case, the second gate electrode 160 of the thin film transistor (T) may be electrically connected with the predetermined line. Also, the respective second gate electrodes 160 of the first and second transistors (ST1, ST2) may be connected with other signal lines instead of the k-th gate line (Gk) and the k-th sensing line (Sk).

Figure 16:
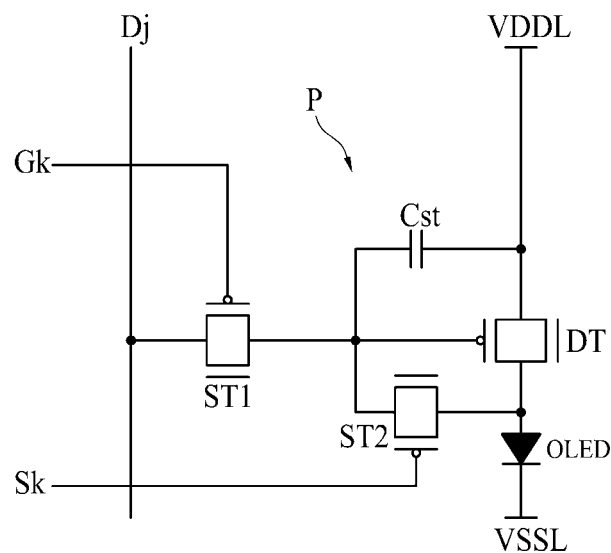
FIG. 16 is a circuit diagram illustrating another example of a pixel in the display device according to the embodiment of the present disclosure.

FIG. 16 is a circuit diagram illustrating another example of the pixel in the display device according to the embodiment of the present disclosure. Referring to FIG. 16, the pixel (P) of the display device according to the embodiment of the present disclosure may include an organic light emitting diode (OLED), a driving transistor (DT), first and second transistors (ST1, ST2), and a capacitor (Cst).

The organic light emitting diode (OLED) emits light in accordance with a current supplied through the driving transistor (DT). An anode electrode of the organic light emitting diode (OLED) may be connected with a drain electrode of the driving transistor (DT), and a cathode electrode of the organic light emitting diode (OLED) may be connected with a first source voltage line (VSSL) supplied with a first source voltage. The first source voltage line (VSSL) may be a low potential voltage line supplied with a low potential source voltage.

The organic light emitting diode (OLED) may include the anode electrode, a hole transporting layer, an organic light emitting layer, an electron transporting layer, and the cathode electrode. When a voltage is applied to the anode electrode and the cathode electrode of the organic light emitting diode (OLED), hole and electron are respectively transferred to the organic light emitting layer through the hole transporting layer and the electron transporting layer, and a bond of the hole and electron in the organic light emitting layer makes a light emission.

The driving transistor (DT) is disposed between the organic light emitting diode (OLED) and a second source voltage line (VDDL) supplied with a second source voltage. The driving transistor (DT) adjusts a current flowing from the second source voltage line (VDDL) to the organic light emitting diode (OLED) in accordance with a voltage difference between the gate electrode and the source electrode. The second source voltage line (VDD) may be a high potential voltage line supplied with a high potential source voltage.

The first transistor (ST1) is turned-on by the k-th gate signal of the k-th gate line (Gk), to thereby supply the voltage of the j-th data line (Dj) to the gate electrode of the driving transistor (DT). The second transistor (ST2) is turned-on by the k-th sensing signal of the k-th sensing line (Sk), to thereby connect the gate electrode and the drain electrode of the driving transistor (DT) with each other.

The capacitor (Cst) is provided between the gate electrode and the source electrode of the driving transistor (DT). The capacitor (Cst) stores a differential voltage between the gate voltage and the source voltage of the driving transistor (DT).

In this embodiment of the present disclosure, any one of the first and second gate electrodes may be connected with the predetermined line or electrode so that it is possible to provide the thin film transistor (T) which is selectively realized in the N-type thin film transistor or the P-type thin film transistor. In FIG. 16, only the second gate electrode 160 of the thin film transistor (T) is connected with the predetermined line or electrode, whereby the thin film transistor (T) is realized in the P-type thin film transistor.

Referring to FIG. 16, the second gate electrode 160 of the driving transistor (DT) is connected with the second drain electrode 144 of the first transistor (ST1), the second source electrode 143 is connected with the second source voltage line (VDD), and the second drain electrode 144 is connected with the anode electrode of the organic light emitting diode (OLED). The first gate electrode 110 of the driving transistor (DT) is not connected with any one line, electrically. The first source electrode 141 of the driving transistor (DT) may be connected with the anode electrode of the organic light emitting diode (OLED), and the first drain electrode 142 may be connected with the second source voltage line (VDD), but not limited to this structure. The first source electrode 141 and the first drain electrode 142 may not be electrically connected with any one line.

Also, the second gate electrode 160 of the first transistor (ST1) is connected with the k-th gate line (Gk), the second source electrode 143 is connected with the j-th data line (Dh), and the second drain electrode 144 is connected with the first gate electrode 110 of the driving transistor (DT). The first gate electrode 110 of the first transistor (ST1) is not electrically connected with any one line. The first source electrode 141 of the first transistor (ST1) may be connected with the first gate electrode 110 of the driving transistor (DT), and the first drain electrode 142 may be connected with the j-th data line (Dh), but not limited to this structure. The first source electrode 141 and the first drain electrode 142 may not be electrically connected with any one line.

Also, the second gate electrode 160 of the second transistor (ST2) is connected with the k-th sensing line (Sk), the second source electrode 143 is connected with the second drain electrode 144 of the driving transistor (DT), and the second drain electrode 144 is connected with the second gate electrode 160 of the driving transistor (DT). The first gate electrode 110 of the second transistor (ST2) is not electrically connected with any one line. The first source electrode 141 of the second transistor (ST2) may be connected with the second gate electrode 160 of the driving transistor (DT), and the first drain electrode 142 may be connected with the second drain electrode 144 of the driving transistor (DT), but not limited to this structure. The first source electrode 141 and the first drain electrode 142 may not be electrically connected with any one line.

As described above, the thin film transistor according to the embodiment of the present disclosure has the N-type semiconductor properties and the P-type semiconductor properties. However, the thin film transistor according to the embodiment of the present disclosure uses only the P-type semiconductor properties, whereby the thin film transistor according to the embodiment of the present disclosure may be applied to the thin film transistor of the pixel (P) in the organic light emitting display device.

Meanwhile, FIG. 16 shows that the driving transistor (DT) and the first and second transistors (ST1, ST2) use only the P-type semiconductor properties. However, the thin film transistor (T) may use the N-type semiconductor properties and the P-type semiconductor properties. In this case, the first gate electrode 110 of the driving transistor (DT) may be electrically connected with the predetermined line. Also, the respective first gate electrodes 110 of the first and second transistors (ST1, ST2) may be connected with other signal lines instead of the k-th gate line (Gk) and the k-th sensing line (Sk).

Figure 17:
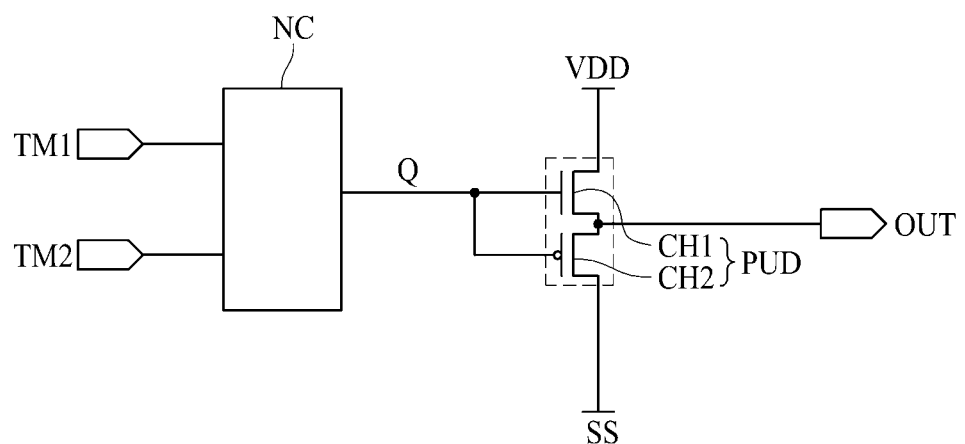
FIG. 17 is a circuit diagram illustrating one example of the gate driver according to the embodiment of the present disclosure.

FIG. 17 is a circuit diagram illustrating one example of the gate driver according to the embodiment of the present disclosure. Referring to FIG. 17, the gate driver according to the embodiment of the present disclosure includes a plurality of stages for sequentially outputting the gate signals. Each of the plurality of stages may include a pull-up node (Q), an output control thin film transistor (PUD), and a node control circuit (NC).

The node control circuit (NC) controls a voltage of the pull-up node (Q) in response to a control signal which is input through a control terminal, whereby the voltage of the pull-up node (Q) becomes a high-potential voltage or a low-potential voltage under the control of the node control circuit (NC). For example, the node control circuit (NC) charges the pull-up node (Q) with the high-potential voltage in response to the signal which is input through a first terminal (TM1). The pull-up node (Q) may be discharged to be the low-potential voltage by the node control circuit (NC) in response to the signal which is input through a second terminal (TM2).

If the pull-up node (Q) is charged with the high-potential voltage, the first channel area (CH1) is turned-on so that the output control thin film transistor (PUD) supplies the high-potential voltage (or a clock supplied through a clock terminal (CLK)) to an output terminal (OUT). If the pull-up node (Q) is charged with the low-potential voltage, the second channel area (CH2) is turned-on so that the output terminal (OUT) is discharged to be low-potential voltage by the output control thin film transistor (PUD).

The respective first and second gate electrodes 110 and 160 of the output control thin film transistor (PUD) are connected with the pull-up node (Q), the first source electrode 141 and the second drain electrode 144 are connected with the output terminal (OUT), the first drain electrode 142 is connected with a high-potential voltage source (VDD), and the second source electrode 143 is connected with a low-potential voltage source (VSS).

In the related art, the gate signal is output by the use of pull-up transistor and pull-down transistor, wherein the pull-up transistor, which is turned-on when the pull-up node is charged with the high-potential voltage, supplies the high-potential voltage to the output terminal (OUT), and the pull-down transistor, which is turned-on when the pull-down node is charged with the high-potential voltage, makes the output terminal (OUT) discharged to be the low-potential voltage. However, according to the present disclosure, the first channel area (CH1) having the N-type semiconductor properties functions as the pull-up transistor, and the second channel area (CH2) having the P-type semiconductor properties functions as the pull-down transistor, so that it is possible to output the gate signal by one thin film transistor. Accordingly, it is possible to omit the pull-down node, and also to decrease the size of the thin film transistor. Furthermore, it is possible to decrease the size of the gate driver, and to decrease the size of the non-display area in the display device when the gate driver is manufactured in the GIP method.

As described above, the thin film transistor according to the embodiment of the present disclosure may be implemented as a N-type, a P-type or a combination of the N-type and the P-type. For example, all of the thin film transistor may be implemented as the N-type or the P-type. Alternatively, some of the thin film transistors may be implemented as the n-type, and rest of them may be implemented as the p-type. Also, the thin film transistor according to the embodiment of the present disclosure may be formed in other area of the display panel including an active area and a non-active area, as well as the pixels P and the gate driver 1200.

By way of summation and review, according to the embodiments of the present disclosure, since the thin film transistor includes both the N-type semiconductor layer and the p-type semiconductor layer, the first channel area is formed in an overlapping area of the first gate electrode and the N-type semiconductor layer, and the second channel area is formed in an overlapping area of the second gate electrode and the P-type semiconductor layer. Therefore, the thin film transistor has both the N-type semiconductor properties and the P-type semiconductor properties.

Moreover, according to the embodiments of the present disclosure, the electrode is formed to connect the first drain electrode with the second drain electrode. Therefore, the thin film transistor may function as the complementary metal oxide semiconductor (CMOS).

Moreover, according to the embodiments of the present disclosure, the N-type semiconductor layer and the p-type semiconductor layer are manufactured while being maintained under a vacuum state. That is, the N-type semiconductor layer and the P-type semiconductor layer are sequentially deposited while being maintained under the vacuum state within one chamber. Therefore, the P-type semiconductor layer 132 may be formed of $Cu_2O$. Also, the interface between the N-type semiconductor layer and the P-type semiconductor layer may be stable.

Moreover, according to the embodiments of the present disclosure, the thin film transistor may be implemented as a N-type, a P-type or a combination of the n-type and the p-type.

Furthermore, according to the embodiments of the present disclosure, the thin film transistor may use an output control transistor that functions as the pull-up transistor and the pull-down transistor. Therefore, the size of the gate driver may be decreased.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor comprising:
a first gate electrode disposed on a substrate;
a first gate insulating film covering the first gate electrode;
a semiconductor layer disposed on the first gate insulating film;
a second gate insulating film covering the semiconductor layer;
a second gate electrode disposed on the second gate insulating film, the second gate electrode non-overlapping with the first gate electrode,
a drain electrode on the semiconductor layer, the drain electrode including a first drain electrode portion at a first end of the drain electrode and a second drain electrode portion at a second end of the drain electrode that is opposite the first end;
wherein the semiconductor layer includes an N-type semiconductor portion and a P-type semiconductor portion on the N-type semiconductor portion, and the P-type semiconductor portion is in contact with the N-type semiconductor portion,
wherein a first overlapping area is between the first gate electrode and the first drain electrode portion and the N-type semiconductor portion such that the first gate electrode overlaps and is below the N-type semiconductor portion and the P-type semiconductor portion, wherein the N-type semiconductor portion in the first overlapping area is a first channel area, and
wherein a second overlapping area is between the second gate electrode and the second drain electrode portion and the P-type semiconductor portion where the second gate electrode overlaps and is above the P-type semiconductor portion and the N-type semiconductor portion, wherein the P-type semiconductor portion in the second overlapping area is a second channel area.

2. The thin film transistor according to claim 1, wherein a thickness of the P-type semiconductor portion is less than half of a thickness of the N-type semiconductor portion.

3. The thin film transistor according to claim 1, wherein a first portion of the semiconductor layer is overlapped with the first gate electrode, and wherein a second portion of the semiconductor layer is overlapped with the second gate electrode.

4. The thin film transistor according to claim 1, further comprising:
a light shielding layer formed of a same material as the first gate electrode, the light shielding layer overlapping the second channel area and in a same layer of the thin film transistor as the first gate electrode.

5. The thin film transistor according to claim 1, further comprising:
a plurality of source electrodes on the semiconductor layer, the plurality of source electrodes including a first source electrode and a second source electrode; and
wherein the first drain electrode portion and the second drain electrode portion are between the first source electrode and the second source electrode.

6. The thin film transistor according to claim 5, wherein the first source electrode and the first drain electrode portion are overlapped with the first gate electrode, and wherein the second source electrode and the second drain electrode portion are overlapped with the second gate electrode.

7. The thin film transistor according to claim 6, wherein at least one of the first drain electrode portion and the second drain electrode portion and the plurality of source electrodes includes a metal material having a work function of 5.0 eV.

8. The thin film transistor according to claim 5, further comprising:
a connection electrode on the semiconductor layer, the connection electrode connecting together the first drain electrode portion and the second drain electrode portion.

9. The thin film transistor according to claim 1, further comprising:
an insulating interlayer covering the second gate electrode; and
a plurality of source electrodes on the insulating interlayer, the plurality of source electrodes including a first source electrode and a second source electrode; and
wherein the first drain electrode portion and the second drain electrode portion are on the insulating interlayer,
wherein each of the first drain electrode portion, the second drain electrode portion, and the plurality of source electrodes is connected to the semiconductor layer through a corresponding contact hole that penetrates through the insulating interlayer and the second gate insulating film.

10. The thin film transistor according to claim 9, wherein at least one of the first drain electrode portion, the second drain electrode portion, and the plurality of source electrodes includes a metal material having a work function of 5.0 eV.

11. The thin film transistor according to claim 9, wherein the first source electrode and the first drain electrode portion are overlapped with the first gate electrode, and wherein the second gate electrode is horizontally between the second source electrode and the second drain electrode portion.

12. The thin film transistor according to claim 9, further comprising: a connection electrode on the insulating interlayer, the connection electrode connecting together the first drain electrode portion and the second drain electrode portion.

13. The thin film transistor according to claim 1, wherein the N-type semiconductor portion is an N-type oxide semiconductor portion, and the P-type semiconductor portion is a P-type oxide semiconductor portion.

14. The thin film transistor according to claim 13, wherein the P-type semiconductor portion is formed of copper oxide ($Cu_2O$).

15. A method for manufacturing a thin film transistor comprising:
providing a first gate electrode on a substrate;
providing a first gate insulating film that covers the first gate electrode;
providing a semiconductor layer including an N-type semiconductor portion and a P-type semiconductor portion on the N-type semiconductor portion on the first gate insulating film, the P-type semiconductor portion is in contact with the N-type semiconductor portion;
providing a drain electrode on the semiconductor layer, the drain electrode including a first drain electrode portion at a first end of the drain electrode and a second drain electrode portion at a second end of the drain electrode that is opposite the first end;
providing a second gate insulating film that covers the semiconductor layer and the drain electrode; and
providing a second gate electrode on the second gate insulating film, the second gate electrode non-overlapping with the first gate electrode, wherein a first overlapping area is between the first gate electrode and the first drain electrode portion and the N-type semiconductor portion such that the first gate electrode overlaps and is below the N-type semiconductor portion and the P-type semiconductor portion, wherein the N-type semiconductor portion in the first overlapping area is a first channel area, and wherein a second overlapping area is between the second gate electrode and the second drain electrode portion and the P-type semiconductor portion where the second gate electrode overlaps and is above the P-type semiconductor portion and the N-type semiconductor portion, wherein the P-type semiconductor portion in the second overlapping area is a second channel area.

16. The method according to claim 15, wherein a first portion of the semiconductor layer is overlapped with the first gate electrode and wherein a second portion of the semiconductor layer is overlapped with the second gate electrode.

17. The method according to claim 15, wherein providing the semiconductor layer includes:
providing the N-type semiconductor portion on the first gate insulating film; and
providing the P-type semiconductor portion on the N-type semiconductor portion,
wherein the N-type semiconductor portion and the P-type semiconductor portion are sequentially deposited under a same vacuum condition within one chamber.

18. A display device comprising:
a display panel including a plurality of data lines, a plurality of gate lines, and a plurality of pixels provided at cross sections of the plurality of gate and the plurality of data lines;
a data driving circuit that supplies data voltages to the plurality of data lines; and
a gate driving circuit that supplies gate signals to the plurality of gate lines,
wherein each of the plurality of pixels or the gate driving circuit includes a thin film transistor,
wherein the thin film transistor comprises:
a first gate electrode disposed on a substrate;
a first gate insulating film covering the first gate electrode;
a semiconductor layer disposed on the first gate insulating film;
a drain electrode on the semiconductor layer, the drain electrode including a first drain electrode portion at a first end of the drain electrode and a second drain electrode portion at a second end of the drain electrode that is opposite the first end;
a second gate insulating film covering the semiconductor layer; and
a second gate electrode disposed on the second gate insulating film, the second gate electrode non-overlapping with the first gate electrode,
wherein the semiconductor layer includes an N-type semiconductor portion and a P-type semiconductor portion on the N-type semiconductor portion, and the P-type semiconductor portion is in contact with the N-type semiconductor portion,
wherein a first overlapping area is between the first gate electrode and the first drain electrode portion and the N-type semiconductor portion such that the first gate electrode overlaps and is below the N-type semiconductor portion and the P-type semiconductor portion, wherein the N-type semiconductor portion in the first overlapping area is a first channel area, and
wherein a second overlapping area is between the second gate electrode and the second drain electrode portion and the P-type semiconductor portion where the second gate electrode overlaps and is above the P-type semiconductor portion and the N-type semiconductor portion, wherein the P-type semiconductor portion in the second overlapping area is a second channel area.

* * * * *